(12) United States Patent
Lomp et al.

(10) Patent No.: US 9,564,963 B2
(45) Date of Patent: Feb. 7, 2017

(54) AUTOMATIC POWER CONTROL SYSTEM FOR A CODE DIVISION MULTIPLE ACCESS (CDMA) COMMUNICATIONS SYSTEM

(75) Inventors: Gary R. Lomp, Centerport, NY (US); Faith M. Ozluturk, Port Washington, NY (US); John Kowalski, Camas, WA (US)

(73) Assignee: InterDigital Technology Corporation, Wilmington, DE (US)

( * ) Notice: Subject to any disclaimer, the term of this patent is extended or adjusted under 35 U.S.C. 154(b) by 1483 days.

(21) Appl. No.: 12/340,939

(22) Filed: Dec. 22, 2008

(65) Prior Publication Data

US 2009/0103508 A1   Apr. 23, 2009

Related U.S. Application Data

(63) Continuation of application No. 10/084,007, filed on Feb. 27, 2002, now Pat. No. 7,502,406, which is a
(Continued)

(51) Int. Cl.
*H04L 27/00* (2006.01)
*H04B 7/26* (2006.01)
(Continued)

(52) U.S. Cl.
CPC ........... *H04B 7/2637* (2013.01); *G06F 13/374* (2013.01); *H03H 17/0226* (2013.01); *H04B 1/707* (2013.01); *H04B 1/708* (2013.01); *H04B 1/709* (2013.01); *H04B 1/7075* (2013.01); *H04B 1/7085* (2013.01); *H04B 1/7093* (2013.01); *H04B 1/70753* (2013.01);
(Continued)

(58) Field of Classification Search
USPC ........ 375/142, 144, 148; 370/330, 331, 332, 370/335, 342, 441, 479; 455/13.4, 33.2, 455/38.3
See application file for complete search history.

(56) References Cited

U.S. PATENT DOCUMENTS 3,700,820 A   10/1972   Blasbalg et al.
3,761,610 A    9/1973   Krallinger et al.
(Continued)

FOREIGN PATENT DOCUMENTS

CA   2186031   9/1995
CA   2175749   11/1996
(Continued)

OTHER PUBLICATIONS

Alavi, Power Control and Interference Management in a Spread-Spectrum Cellular Mobile Radio System, (1984) (unpublished Ph.D. thesis—Michigan State University Department of Electrical Engineering and Systems Science) (on file with the Michigan State University Libraries).
(Continued)

*Primary Examiner* — Dac Ha
(74) *Attorney, Agent, or Firm* — Volpe and Koenig, P.C.

(57) ABSTRACT

A receiver receives signals and noise over a frequency spectrum of a desired received signal. The desired received signal is spread using code division multiple access. The received signals and noise are demodulated to produce a demodulated signal. The demodulated signal is despread using a code uncorrelated with a code associated with the desired received signal. A power level of the despread demodulated signal is measured as an estimate of the noise level of the frequency spectrum.

24 Claims, 8 Drawing Sheets

Related U.S. Application Data continuation of application No. 09/833,285, filed on Apr. 12, 2001, now Pat. No. 6,873,645, which is a continuation of application No. 09/406,162, filed on Sep. 27, 1999, now abandoned, which is a continuation of application No. 08/669,770, filed on Jun. 27, 1996, now Pat. No. 5,991,329.

(60) Provisional application No. 60/000,775, filed on Jun. 30, 1995.

(51) Int. Cl.

| | | |
|---|---|---|
| H04B 1/707 | (2011.01) | |
| H04B 1/7075 | (2011.01) | |
| H04B 1/708 | (2011.01) | |
| H04B 1/7085 | (2011.01) | |
| H04B 1/709 | (2011.01) | |
| H04B 1/7093 | (2011.01) | |
| H04B 1/711 | (2011.01) | |
| H04J 13/00 | (2011.01) | |
| H04J 13/10 | (2011.01) | |
| H04L 25/02 | (2006.01) | |
| H04L 27/20 | (2006.01) | |
| H04L 27/233 | (2006.01) | |
| H04W 52/04 | (2009.01) | |
| H04W 52/08 | (2009.01) | |
| H04W 52/14 | (2009.01) | |
| H04W 52/24 | (2009.01) | |
| H04W 52/32 | (2009.01) | |
| H04W 52/34 | (2009.01) | |
| H04W 52/36 | (2009.01) | |
| H04W 52/50 | (2009.01) | |
| H04W 52/52 | (2009.01) | |
| H04W 52/54 | (2009.01) | |
| G06F 13/374 | (2006.01) | |
| H03H 17/02 | (2006.01) | |
| H04L 5/14 | (2006.01) | |
| H04N 1/00 | (2006.01) | |
| H04N 1/333 | (2006.01) | |
| H04B 1/7115 | (2011.01) | |
| H04B 1/712 | (2011.01) | |
| H04J 13/12 | (2011.01) | |
| H04L 1/00 | (2006.01) | |
| H04W 52/26 | (2009.01) | |
| H04W 52/44 | (2009.01) | |
| H04W 52/60 | (2009.01) | |
| H03H 17/06 | (2006.01) | |
| H04B 1/7077 | (2011.01) | |
| H04J 13/16 | (2011.01) | |

(52) U.S. Cl.
CPC ..... *H04B 1/70754* (2013.01); *H04B 1/70755* (2013.01); *H04B 1/70758* (2013.01); *H04B 1/711* (2013.01); *H04B 7/2628* (2013.01); *H04J 13/00* (2013.01); *H04J 13/10* (2013.01); *H04J 13/107* (2013.01); *H04L 1/004* (2013.01); *H04L 1/0042* (2013.01); *H04L 1/0059* (2013.01); *H04L 5/1446* (2013.01); *H04L 25/0212* (2013.01); *H04L 27/206* (2013.01); *H04L 27/2332* (2013.01); *H04N 1/00912* (2013.01); *H04N 1/3333* (2013.01); *H04W 52/04* (2013.01); *H04W 52/08* (2013.01); *H04W 52/143* (2013.01); *H04W 52/24* (2013.01); *H04W 52/241* (2013.01); *H04W 52/245* (2013.01); *H04W 52/262* (2013.01); *H04W 52/322* (2013.01); *H04W 52/325* (2013.01); *H04W 52/346* (2013.01); *H04W 52/36* (2013.01); *H04W 52/50* (2013.01); *H04W 52/52* (2013.01); *H04W 52/54* (2013.01); *H03H 17/06* (2013.01); *H04B 1/7077* (2013.01); *H04B 1/712* (2013.01); *H04B 1/7115* (2013.01); *H04B 7/264* (2013.01); *H04B 2201/7071* (2013.01); *H04B 2201/70701* (2013.01); *H04B 2201/70702* (2013.01); *H04B 2201/70703* (2013.01); *H04B 2201/70707* (2013.01); *H04J 13/004* (2013.01); *H04J 13/0048* (2013.01); *H04J 13/0077* (2013.01); *H04J 13/12* (2013.01); *H04J 13/16* (2013.01); *H04J 2013/0037* (2013.01); *H04L 1/0001* (2013.01); *H04L 1/0047* (2013.01); *H04L 1/0054* (2013.01); *H04L 2027/003* (2013.01); *H04L 2027/0053* (2013.01); *H04N 2201/3335* (2013.01); *H04W 52/146* (2013.01); *H04W 52/247* (2013.01); *H04W 52/26* (2013.01); *H04W 52/367* (2013.01); *H04W 52/44* (2013.01); *H04W 52/60* (2013.01); *Y02B 60/1228* (2013.01); *Y02B 60/50* (2013.01)

(56) References Cited

U.S. PATENT DOCUMENTS

| | | |
|---|---|---|
| 4,069,392 A | 1/1978 | Goldenberg et al. |
| 4,092,601 A | 5/1978 | Lee et al. |
| 4,156,277 A | 5/1979 | Seitz et al. |
| 4,228,538 A | 10/1980 | Scharla-Nielsen et al. |
| 4,292,623 A | 9/1981 | Eswaran et al. |
| 4,320,513 A | 3/1982 | Lampert |
| 4,384,307 A | 5/1983 | Kuzmik et al. |
| 4,385,206 A | 5/1983 | Bradshaw et al. |
| 4,403,322 A | 9/1983 | Kato et al. |
| 4,417,042 A | 11/1983 | Dziark |
| 4,425,665 A | 1/1984 | Stauffer |
| 4,458,314 A | 7/1984 | Grimes |
| 4,470,154 A | 9/1984 | Yano |
| 4,480,307 A | 10/1984 | Budde et al. |
| 4,516,272 A | 5/1985 | Yano |
| 4,570,220 A | 2/1986 | Tetrick et al. |
| 4,583,124 A | 4/1986 | Tsuji et al. |
| 4,599,732 A | 7/1986 | LeFever |
| 4,608,700 A | 8/1986 | Kirtley, Jr. et al. |
| 4,625,308 A | 11/1986 | Kim et al. |
| 4,630,126 A | 12/1986 | Kaku et al. |
| 4,630,283 A | 12/1986 | Schiff |
| 4,646,232 A | 2/1987 | Chang et al. |
| 4,667,192 A | 5/1987 | Schmid et al. |
| 4,668,990 A | 5/1987 | Kondo et al. |
| 4,675,863 A | 6/1987 | Paneth et al. |
| 4,675,865 A | 6/1987 | DeVries et al. |
| 4,709,343 A | 11/1987 | Van Chang |
| 4,744,079 A | 5/1988 | Csapo et al. |
| 4,768,145 A | 8/1988 | Wheelwright et al. |
| 4,785,463 A | 11/1988 | Janc et al. |
| 4,794,590 A | 12/1988 | Yano |
| 4,802,189 A | 1/1989 | Wedler |
| 4,807,226 A | 2/1989 | Naka |
| 4,811,262 A | 3/1989 | White |
| 4,811,421 A | 3/1989 | Havel et al. |
| 4,839,887 A | 6/1989 | Yano |
| 4,841,527 A | 6/1989 | Raychaudhuri et al. |
| 4,862,402 A | 8/1989 | Shah et al. |
| 4,876,554 A | 10/1989 | Tubbs |
| 4,885,742 A | 12/1989 | Yano |
| 4,901,265 A | 2/1990 | Kerr et al. |
| 4,901,307 A | 2/1990 | Gilhousen et al. |
| 4,905,177 A | 2/1990 | Weaver, Jr. et al. |
| 4,912,722 A | 3/1990 | Carlin |
| 4,914,574 A | 4/1990 | Terada et al. |
| 4,926,130 A | 5/1990 | Weaver |

(56) References Cited

U.S. PATENT DOCUMENTS

| | | |
|---|---|---|
| 4,928,274 A | 5/1990 | Gilhousen et al. |
| 4,930,140 A | 5/1990 | Cripps et al. |
| 4,940,771 A | 7/1990 | Maresca |
| 4,965,533 A | 10/1990 | Gilmore |
| 4,965,792 A | 10/1990 | Yano |
| 4,969,159 A | 11/1990 | Belcher et al. |
| 4,979,170 A | 12/1990 | Gilhousen et al. |
| 5,017,926 A | 5/1991 | Ames et al. |
| 5,021,891 A | 6/1991 | Lee |
| 5,022,024 A | 6/1991 | Paneth et al. |
| 5,022,046 A | 6/1991 | Morrow, Jr. |
| 5,022,049 A | 6/1991 | Abrahamson et al. |
| 5,027,306 A | 6/1991 | Dattorro et al. |
| 5,028,887 A | 7/1991 | Gilmore |
| 5,050,004 A | 9/1991 | Morton, Jr. |
| 5,056,109 A | 10/1991 | Gilhousen et al. |
| 5,073,900 A | 12/1991 | Mallinckrodt |
| 5,081,643 A | 1/1992 | Schilling |
| 5,084,900 A | 1/1992 | Taylor |
| 5,093,840 A | 3/1992 | Schilling |
| 5,099,204 A | 3/1992 | Wheatley, III |
| 5,099,493 A | 3/1992 | Zeger et al. |
| 5,101,416 A | 3/1992 | Fenton et al. |
| 5,101,501 A | 3/1992 | Gilhousen et al. |
| 5,103,459 A | 4/1992 | Gilhousen et al. |
| 5,105,423 A | 4/1992 | Tanaka et al. |
| 5,107,225 A | 4/1992 | Wheatley, III et al. |
| 5,107,345 A | 4/1992 | Lee |
| 5,107,487 A | 4/1992 | Vilmur et al. |
| 5,109,390 A | 4/1992 | Gilhousen et al. |
| 5,113,525 A | 5/1992 | Andoh |
| 5,115,429 A | 5/1992 | Hluchyj et al. |
| 5,117,385 A | 5/1992 | Gee |
| 5,126,748 A | 6/1992 | Ames et al. |
| 5,128,623 A | 7/1992 | Gilmore |
| 5,140,613 A | 8/1992 | Birgenheier et al. |
| 5,142,278 A | 8/1992 | Moallemi et al. |
| 5,151,919 A | 9/1992 | Dent |
| 5,159,283 A | 10/1992 | Jensen |
| 5,159,551 A | 10/1992 | Brunnett et al. |
| 5,159,608 A | 10/1992 | Falconer et al. |
| 5,161,168 A | 11/1992 | Schilling |
| 5,166,929 A | 11/1992 | Lo |
| 5,166,951 A | 11/1992 | Schilling |
| 5,166,952 A | 11/1992 | Omurg et al. |
| 5,179,571 A | 1/1993 | Schilling |
| 5,179,572 A | 1/1993 | Schilling |
| 5,185,762 A | 2/1993 | Schilling |
| 5,193,094 A | 3/1993 | Viterbi |
| 5,193,102 A | 3/1993 | Meidan et al. |
| 5,199,061 A | 3/1993 | Kim |
| 5,204,874 A | 4/1993 | Falconer et al. |
| 5,204,876 A | 4/1993 | Bruckert et al. |
| 5,210,771 A | 5/1993 | Schaeffer et al. |
| 5,216,692 A | 6/1993 | Ling |
| 5,224,120 A | 6/1993 | Schilling |
| 5,228,053 A | 7/1993 | Miller et al. |
| 5,228,054 A | 7/1993 | Rueth et al. |
| 5,228,056 A | 7/1993 | Schilling |
| 5,233,630 A | 8/1993 | Wolf |
| 5,235,614 A | 8/1993 | Bruckert et al. |
| 5,237,586 A | 8/1993 | Bottomley |
| 5,239,557 A | 8/1993 | Dent |
| 5,239,685 A | 8/1993 | Moe et al. |
| 5,241,690 A | 8/1993 | Larsson et al. |
| 5,245,629 A | 9/1993 | Hall |
| 5,247,702 A | 9/1993 | Su et al. |
| 5,253,268 A | 10/1993 | Omura et al. |
| 5,253,347 A | 10/1993 | Bagnoli et al. |
| 5,257,283 A | 10/1993 | Gilhousen et al. |
| 5,258,940 A | 11/1993 | Coker et al. |
| 5,260,967 A | 11/1993 | Schilling |
| 5,260,998 A | 11/1993 | Takagi |
| 5,262,974 A | 11/1993 | Hausman et al. |
| 5,263,045 A | 11/1993 | Schilling |
| 5,265,119 A | 11/1993 | Gilhousen et al. |
| 5,267,238 A | 11/1993 | Yano et al. |
| 5,267,244 A | 11/1993 | Messerschmitt et al. |
| 5,267,261 A | 11/1993 | Blakeney, III et al. |
| 5,267,262 A | 11/1993 | Wheatley, III |
| 5,268,900 A | 12/1993 | Hluchyj |
| 5,274,474 A | 12/1993 | Medina |
| 5,274,665 A | 12/1993 | Schilling |
| 5,276,261 A | 1/1994 | Mayer et al. |
| 5,276,684 A | 1/1994 | Pearson |
| 5,276,907 A | 1/1994 | Meidan |
| 5,278,822 A | 1/1994 | Yashiki |
| 5,280,472 A | 1/1994 | Gilhousen et al. |
| 5,280,537 A | 1/1994 | Sugiyama et al. |
| 5,283,536 A | 2/1994 | Wheatley, III et al. |
| 5,287,299 A | 2/1994 | Lin |
| 5,287,463 A | 2/1994 | Frame et al. |
| 5,289,527 A | 2/1994 | Tiedemann, Jr. |
| 5,291,515 A | 3/1994 | Uchida et al. |
| 5,293,641 A | 3/1994 | Kallin et al. |
| 5,295,152 A | 3/1994 | Gudmundson et al. |
| 5,295,153 A | 3/1994 | Gudmundson |
| 5,297,161 A | 3/1994 | Ling |
| 5,297,162 A | 3/1994 | Lee et al. |
| 5,299,226 A | 3/1994 | Schilling |
| 5,299,228 A | 3/1994 | Hall |
| 5,305,308 A | 4/1994 | English et al. |
| 5,305,349 A | 4/1994 | Dent |
| 5,305,468 A | 4/1994 | Bruckert et al. |
| 5,307,405 A | 4/1994 | Sih |
| 5,309,474 A | 5/1994 | Gilhousen et al. |
| 5,311,176 A | 5/1994 | Gurney |
| 5,311,459 A | 5/1994 | D'Luna et al. |
| 5,316,422 A | 5/1994 | Coffman |
| 5,319,450 A | 6/1994 | Tamayama et al. |
| 5,321,721 A | 6/1994 | Yamaura et al. |
| 5,327,455 A | 7/1994 | De Gaudenzi et al. |
| 5,327,467 A | 7/1994 | De Gaudenzi et al. |
| 5,329,547 A | 7/1994 | Ling |
| 5,333,175 A | 7/1994 | Ariyavisitakul et al. |
| 5,337,338 A | 8/1994 | Sutton et al. |
| 5,339,046 A | 8/1994 | Kornfeld et al. |
| 5,339,174 A | 8/1994 | Harris |
| 5,339,184 A | 8/1994 | Tang |
| 5,339,330 A | 8/1994 | Mallinckrodt |
| 5,341,395 A | 8/1994 | Bi |
| 5,341,396 A | 8/1994 | Higgins et al. |
| 5,341,397 A | 8/1994 | Gudmundson |
| 5,341,427 A | 8/1994 | Hardy et al. |
| 5,341,456 A | 8/1994 | DeJaco |
| 5,343,335 A | 8/1994 | Hara |
| 5,345,467 A | 9/1994 | Lomp et al. |
| 5,345,596 A | 9/1994 | Buchenhorner et al. |
| 5,345,598 A | 9/1994 | Dent |
| 5,347,536 A | 9/1994 | Meehan |
| 5,347,569 A | 9/1994 | Yamamoto |
| 5,349,606 A | 9/1994 | Lovell et al. |
| 5,351,134 A | 9/1994 | Yaguchi et al. |
| 5,351,269 A | 9/1994 | Schilling |
| 5,353,300 A | 10/1994 | Lee et al. |
| 5,353,302 A | 10/1994 | Bi |
| 5,353,332 A | 10/1994 | Raith et al. |
| 5,353,352 A | 10/1994 | Dent et al. |
| 5,355,453 A | 10/1994 | Row et al. |
| 5,359,182 A | 10/1994 | Schilling |
| 5,359,624 A | 10/1994 | Lee et al. |
| 5,361,276 A | 11/1994 | Subramanian |
| 5,363,377 A | 11/1994 | Sharpe |
| 5,363,403 A | 11/1994 | Schilling et al. |
| 5,365,544 A | 11/1994 | Schilling |
| 5,365,551 A | 11/1994 | Snodgrass et al. |
| 5,365,585 A | 11/1994 | Puhl et al. |
| 5,367,533 A | 11/1994 | Schilling |
| 5,373,259 A | 12/1994 | Hackman et al. |
| 5,373,502 A | 12/1994 | Turban |
| 5,377,183 A | 12/1994 | Dent |
| 5,377,223 A | 12/1994 | Schilling |
| 5,377,226 A | 12/1994 | Davis |
| 5,379,242 A | 1/1995 | Rose et al. |

(56) References Cited

U.S. PATENT DOCUMENTS

| | | |
|---|---|---|
| 5,381,443 A | 1/1995 | Borth et al. |
| 5,383,219 A | 1/1995 | Wheatley, III et al. |
| 5,386,589 A | 1/1995 | Kanai |
| 5,390,207 A | 2/1995 | Fenton et al. |
| 5,392,023 A | 2/1995 | D'Avello et al. |
| 5,392,287 A | 2/1995 | Tiedemann, Jr. et al. |
| D356,560 S | 3/1995 | Kornfeld et al. |
| 5,396,516 A | 3/1995 | Padovani et al. |
| 5,396,539 A | 3/1995 | Slekys et al. |
| 5,398,243 A | 3/1995 | Aguilhon et al. |
| 5,404,376 A | 4/1995 | Dent |
| 5,406,559 A | 4/1995 | Edem et al. |
| 5,406,615 A | 4/1995 | Miller, II et al. |
| 5,406,629 A | 4/1995 | Harrison et al. |
| 5,408,697 A | 4/1995 | Price et al. |
| 5,410,568 A | 4/1995 | Schilling |
| 5,412,659 A | 5/1995 | Fujita et al. |
| 5,412,686 A | 5/1995 | Ling |
| 5,414,728 A | 5/1995 | Zehavi |
| 5,414,729 A | 5/1995 | Fenton |
| 5,414,732 A | 5/1995 | Kaufmann |
| 5,414,796 A | 5/1995 | Jacobs et al. |
| 5,416,797 A | 5/1995 | Gilhousen et al. |
| 5,418,624 A | 5/1995 | Ahmed |
| 5,418,813 A | 5/1995 | Schaffner et al. |
| 5,420,593 A | 5/1995 | Niles |
| 5,420,850 A | 5/1995 | Umeda et al. |
| 5,420,864 A | 5/1995 | Dahlin et al. |
| 5,420,896 A | 5/1995 | Schilling |
| 5,422,908 A | 6/1995 | Schilling |
| 5,422,909 A | 6/1995 | Love et al. |
| 5,430,724 A | 7/1995 | Fall et al. |
| 5,430,760 A | 7/1995 | Dent |
| 5,432,815 A | 7/1995 | Kang et al. |
| 5,440,597 A | 8/1995 | Chung et al. |
| 5,440,632 A | 8/1995 | Bacon et al. |
| 5,442,625 A | 8/1995 | Gitlin et al. |
| 5,442,662 A | 8/1995 | Fukasawa et al. |
| 5,446,683 A | 8/1995 | Mullen et al. |
| 5,446,756 A | 8/1995 | Mallinckrodt |
| 5,448,600 A | 9/1995 | Lucas |
| 5,452,339 A | 9/1995 | Siu et al. |
| 5,454,026 A | 9/1995 | Tanaka |
| 5,457,813 A | 10/1995 | Poutanen |
| 5,459,758 A | 10/1995 | Moore |
| 5,459,759 A | 10/1995 | Schilling |
| 5,459,760 A | 10/1995 | Watanabe |
| 5,461,639 A | 10/1995 | Wheatley, III et al. |
| 5,465,269 A | 11/1995 | Schaffner et al. |
| 5,465,399 A | 11/1995 | Oberholtzer et al. |
| 5,469,471 A | 11/1995 | Wheatley, III |
| 5,471,497 A | 11/1995 | Zehavi |
| 5,479,397 A | 12/1995 | Lee |
| 5,481,561 A | 1/1996 | Fang |
| 5,483,549 A | 1/1996 | Weinberg et al. |
| 5,485,486 A | 1/1996 | Gilhousen et al. |
| 5,487,089 A | 1/1996 | Misaizu et al. |
| 5,487,174 A | 1/1996 | Persson |
| 5,487,180 A | 1/1996 | Ohtake |
| 5,488,629 A | 1/1996 | Takahashi et al. |
| 5,490,136 A | 2/1996 | Sereno et al. |
| 5,491,837 A | 2/1996 | Haartsen |
| 5,497,395 A | 3/1996 | Jou |
| 5,499,236 A | 3/1996 | Giallorenzi et al. |
| 5,499,395 A | 3/1996 | Doi et al. |
| 5,504,773 A | 4/1996 | Padovani et al. |
| 5,506,864 A | 4/1996 | Schilling |
| 5,506,865 A | 4/1996 | Weaver, Jr. |
| 5,508,708 A | 4/1996 | Ghosh et al. |
| 5,509,002 A | 4/1996 | Baden et al. |
| 5,509,126 A | 4/1996 | Oprescu et al. |
| 5,511,067 A | 4/1996 | Miller |
| 5,519,736 A | 5/1996 | Ishida |
| 5,521,938 A | 5/1996 | Stewart et al. |
| 5,528,593 A | 6/1996 | English et al. |
| 5,528,624 A | 6/1996 | Kaku et al. |
| 5,535,211 A | 7/1996 | Yano |
| 5,535,238 A | 7/1996 | Schilling et al. |
| 5,535,239 A | 7/1996 | Padovani et al. |
| 5,535,278 A | 7/1996 | Cahn et al. |
| 5,537,397 A | 7/1996 | Abramson |
| 5,537,434 A | 7/1996 | Persson et al. |
| 5,541,606 A | 7/1996 | Lennen |
| 5,544,155 A | 8/1996 | Lucas et al. |
| 5,544,156 A | 8/1996 | Teder et al. |
| 5,544,167 A | 8/1996 | Lucas et al. |
| 5,544,196 A | 8/1996 | Tiedemann, Jr. et al. |
| 5,546,424 A | 8/1996 | Miyake |
| 5,548,613 A | 8/1996 | Kaku et al. |
| 5,548,616 A | 8/1996 | Mucke et al. |
| 5,548,812 A | 8/1996 | Padovani et al. |
| 5,550,810 A | 8/1996 | Monogioudis et al. |
| 5,550,811 A | 8/1996 | Kaku et al. |
| 5,551,057 A | 8/1996 | Mitra |
| 5,559,788 A | 9/1996 | Zscheile et al. |
| 5,559,790 A | 9/1996 | Yano et al. |
| 5,561,669 A | 10/1996 | Lenney et al. |
| 5,563,907 A | 10/1996 | Lomp |
| 5,563,912 A | 10/1996 | Yasunaga et al. |
| 5,564,074 A | 10/1996 | Juntti |
| 5,564,075 A | 10/1996 | Gourgue |
| 5,566,165 A | 10/1996 | Sawahashi et al. |
| 5,566,201 A | 10/1996 | Ostman |
| 5,568,472 A | 10/1996 | Umeda et al. |
| 5,568,483 A | 10/1996 | Padovani et al. |
| 5,568,507 A | 10/1996 | Hershey et al. |
| 5,570,349 A | 10/1996 | Bustamante et al. |
| 5,570,353 A | 10/1996 | Keskitalo et al. |
| 5,570,369 A | 10/1996 | Jokinen |
| 5,572,516 A | 11/1996 | Miya et al. |
| 5,574,747 A | 11/1996 | Lomp |
| 5,574,754 A | 11/1996 | Kurihara et al. |
| 5,574,775 A | 11/1996 | Miller, II et al. |
| 5,574,983 A | 11/1996 | Douzono et al. |
| 5,574,984 A | 11/1996 | Reed et al. |
| 5,577,022 A | 11/1996 | Padovani et al. |
| 5,577,087 A | 11/1996 | Furuya |
| 5,579,374 A | 11/1996 | Doi et al. |
| 5,581,547 A | 12/1996 | Umeda et al. |
| 5,582,851 A | 12/1996 | Hofstetter et al. |
| 5,583,851 A | 12/1996 | Kato et al. |
| 5,585,850 A | 12/1996 | Schwaller |
| 5,586,113 A | 12/1996 | Adachi et al. |
| 5,590,409 A | 12/1996 | Sawahashi et al. |
| 5,592,481 A | 1/1997 | Wiedeman et al. |
| 5,594,718 A | 1/1997 | Weaver, Jr. et al. |
| 5,596,570 A | 1/1997 | Soliman |
| 5,602,832 A | 2/1997 | Hudson |
| 5,602,833 A | 2/1997 | Zehavi |
| 5,603,096 A | 2/1997 | Gilhousen et al. |
| 5,603,113 A | 2/1997 | De Loe, Jr. |
| 5,604,730 A | 2/1997 | Tiedemann, Jr. |
| 5,604,766 A | 2/1997 | Dohi et al. |
| 5,610,940 A | 3/1997 | Durrant et al. |
| 5,613,228 A | 3/1997 | Tuttle et al. |
| 5,614,914 A | 3/1997 | Bolgiano et al. |
| 5,619,524 A | 4/1997 | Ling et al. |
| 5,619,526 A | 4/1997 | Kim et al. |
| 5,621,416 A | 4/1997 | Lennen |
| 5,621,723 A | 4/1997 | Walton, Jr. et al. |
| 5,623,485 A | 4/1997 | Bi |
| 5,623,486 A | 4/1997 | Dohi et al. |
| 5,627,834 A | 5/1997 | Han et al. |
| 5,627,835 A | 5/1997 | Witter |
| 5,627,855 A | 5/1997 | Davidovici |
| 5,629,934 A | 5/1997 | Ghosh et al. |
| 5,629,955 A | 5/1997 | McDonough |
| 5,634,195 A | 5/1997 | Sawyer |
| 5,638,361 A | 6/1997 | Ohlson et al. |
| 5,638,362 A | 6/1997 | Dohi et al. |
| 5,640,414 A | 6/1997 | Blakeney, II et al. |
| 5,644,590 A | 7/1997 | Sugita |
| 5,648,955 A | 7/1997 | Jensen et al. |
| 5,649,292 A | 7/1997 | Doner |

(56) References Cited

U.S. PATENT DOCUMENTS

| | | |
|---|---|---|
| 5,649,299 A | 7/1997 | Battin et al. |
| 5,652,765 A | 7/1997 | Adachi et al. |
| 5,654,955 A | 8/1997 | Natali |
| 5,654,980 A | 8/1997 | Latva-aho et al. |
| 5,657,343 A | 8/1997 | Schilling |
| 5,659,573 A | 8/1997 | Bruckert et al. |
| 5,666,352 A | 9/1997 | Ohgoshi et al. |
| 5,666,654 A | 9/1997 | Kanai |
| 5,673,259 A | 9/1997 | Quick, Jr. |
| 5,673,286 A | 9/1997 | Lomp |
| 5,675,581 A | 10/1997 | Soliman |
| 5,677,929 A | 10/1997 | Asano et al. |
| 5,678,198 A | 10/1997 | Lemson |
| 5,689,502 A | 11/1997 | Scott |
| 5,689,815 A | 11/1997 | Yamazaki et al. |
| 5,691,974 A | 11/1997 | Zehavi et al. |
| 5,692,008 A | 11/1997 | Van Nee |
| 5,710,758 A | 1/1998 | Soliman et al. |
| 5,710,768 A | 1/1998 | Ziv et al. |
| 5,712,869 A | 1/1998 | Lee et al. |
| 5,715,236 A | 2/1998 | Gilhousen et al. |
| 5,715,521 A | 2/1998 | Fukasawa et al. |
| 5,715,526 A | 2/1998 | Weaver et al. |
| 5,715,536 A | 2/1998 | Banks |
| 5,717,713 A | 2/1998 | Natali |
| 5,719,898 A | 2/1998 | Davidovici et al. |
| 5,721,757 A | 2/1998 | Banh et al. |
| 5,722,051 A | 2/1998 | Agrawal et al. |
| 5,722,063 A | 2/1998 | Peterzell et al. |
| 5,724,236 A | 3/1998 | Oglesbee |
| 5,724,385 A | 3/1998 | Levin et al. |
| 5,732,328 A | 3/1998 | Mitra et al. |
| 5,734,639 A | 3/1998 | Bustamante et al. |
| 5,734,647 A | 3/1998 | Yoshida et al. |
| 5,734,648 A | 3/1998 | Adachi et al. |
| 5,737,326 A | 4/1998 | I et al. |
| 5,737,327 A | 4/1998 | Ling et al. |
| 5,745,484 A | 4/1998 | Scott |
| 5,745,520 A | 4/1998 | Love et al. |
| 5,745,531 A | 4/1998 | Sawahashi et al. |
| 5,748,687 A | 5/1998 | Ozluturk |
| 5,751,705 A | 5/1998 | Sato |
| 5,751,739 A | 5/1998 | Seshadri et al. |
| 5,751,761 A | 5/1998 | Gilhousen |
| 5,751,763 A | 5/1998 | Bruckert |
| 5,754,803 A | 5/1998 | Regis |
| 5,757,767 A | 5/1998 | Zehavi |
| 5,758,266 A | 5/1998 | Kornfeld et al. |
| 5,764,687 A | 6/1998 | Easton |
| 5,771,226 A | 6/1998 | Kaku |
| 5,771,451 A | 6/1998 | Takai et al. |
| 5,771,461 A | 6/1998 | Love et al. |
| 5,781,541 A | 7/1998 | Schneider et al. |
| 5,781,542 A | 7/1998 | Tanaka et al. |
| 5,781,584 A | 7/1998 | Zhou et al. |
| 5,784,366 A | 7/1998 | Apelewicz |
| 5,784,406 A | 7/1998 | DeJaco et al. |
| 5,790,591 A | 8/1998 | Gold et al. |
| 5,793,794 A | 8/1998 | Kato et al. |
| 5,796,776 A | 8/1998 | Lomp et al. |
| 5,799,010 A | 8/1998 | Lomp et al. |
| 5,802,046 A | 9/1998 | Scott |
| 5,802,110 A | 9/1998 | Watanabe et al. |
| 5,805,994 A | 9/1998 | Perreault et al. |
| 5,806,003 A | 9/1998 | Jolma et al. |
| 5,809,020 A | 9/1998 | Bruckert et al. |
| 5,812,542 A | 9/1998 | Bruckert et al. |
| 5,812,593 A | 9/1998 | Kaku |
| 5,812,938 A | 9/1998 | Gilhousen et al. |
| 5,815,798 A | 9/1998 | Bhagalia et al. |
| 5,822,310 A | 10/1998 | Chennakeshu et al. |
| 5,822,318 A | 10/1998 | Tiedemann et al. |
| 5,822,359 A | 10/1998 | Bruckert et al. |
| 5,828,662 A | 10/1998 | Jalali et al. |
| 5,828,947 A | 10/1998 | Michel et al. |
| 5,841,768 A | 11/1998 | Ozluturk et al. |
| 5,841,806 A | 11/1998 | Gilhousen et al. |
| 5,842,113 A | 11/1998 | Nanda et al. |
| 5,844,935 A | 12/1998 | Shoji |
| 5,856,971 A | 1/1999 | Gitlin et al. |
| 5,862,489 A | 1/1999 | Aalto |
| 5,870,378 A | 2/1999 | Huang et al. |
| 5,870,393 A | 2/1999 | Yano et al. |
| 5,870,414 A | 2/1999 | Chaib et al. |
| 5,870,427 A | 2/1999 | Tiedemann et al. |
| 5,872,810 A | 2/1999 | Philips et al. |
| 5,873,028 A | 2/1999 | Nakano et al. |
| 5,875,400 A | 2/1999 | Madhavapeddy et al. |
| 5,878,329 A | 3/1999 | Mallinckrodt |
| 5,878,350 A | 3/1999 | Nakamura et al. |
| 5,881,056 A | 3/1999 | Huang et al. |
| 5,881,368 A | 3/1999 | Grob et al. |
| 5,883,889 A | 3/1999 | Faruque |
| 5,883,899 A | 3/1999 | Dahlman et al. |
| 5,884,187 A | 3/1999 | Ziv et al. |
| 5,884,189 A | 3/1999 | Yamazaki |
| 5,884,196 A | 3/1999 | Lekven et al. |
| 5,893,035 A | 4/1999 | Chen |
| 5,896,368 A | 4/1999 | Dahlman et al. |
| 5,898,665 A | 4/1999 | Sawahashi et al. |
| 5,903,552 A | 5/1999 | Raith |
| 5,909,434 A | 6/1999 | Odenwalder et al. |
| 5,909,435 A | 6/1999 | Apelewicz |
| 5,912,919 A | 6/1999 | Lomp et al. |
| 5,918,155 A | 6/1999 | Nakamura et al. |
| 5,920,591 A | 7/1999 | Fukasawa |
| 5,924,015 A | 7/1999 | Garrison et al. |
| 5,926,501 A | 7/1999 | Souissi et al. |
| 5,930,230 A | 7/1999 | Odenwalder et al. |
| 5,930,684 A | 7/1999 | Keskitalo et al. |
| 5,930,704 A | 7/1999 | Kay |
| 5,930,706 A | 7/1999 | Raith |
| 5,933,781 A | 8/1999 | Willenegger et al. |
| 5,940,382 A | 8/1999 | Haim |
| 5,940,771 A | 8/1999 | Gollnick et al. |
| 5,943,361 A | 8/1999 | Gilhousen et al. |
| 5,953,346 A | 9/1999 | Luddy |
| 5,959,080 A | 9/1999 | Scott |
| 5,959,980 A | 9/1999 | Scott |
| 5,966,403 A | 10/1999 | Pon |
| 5,978,412 A | 11/1999 | Takai |
| 5,978,413 A | 11/1999 | Bender |
| 5,987,014 A | 11/1999 | Magill et al. |
| 5,991,329 A | 11/1999 | Lomp et al. |
| 5,991,332 A | 11/1999 | Lomp et al. |
| 5,991,627 A | 11/1999 | Honkasalo et al. |
| 6,005,856 A | 12/1999 | Jensen et al. |
| 6,018,528 A | 1/2000 | Gitlin et al. |
| 6,021,123 A | 2/2000 | Mimura |
| 6,035,197 A | 3/2000 | Haberman et al. |
| 6,038,577 A | 3/2000 | Burshtein |
| 6,049,535 A | 4/2000 | Ozukturk et al. |
| 6,072,787 A | 6/2000 | Hamalainen et al. |
| 6,078,568 A | 6/2000 | Wright et al. |
| 6,088,324 A | 7/2000 | Sato |
| 6,088,335 A | 7/2000 | I et al. |
| 6,088,399 A | 7/2000 | Luz et al. |
| 6,104,748 A | 8/2000 | Kaku |
| 6,108,537 A | 8/2000 | Comer et al. |
| 6,122,292 A | 9/2000 | Watanabe et al. |
| 6,137,840 A | 10/2000 | Tiedemann, Jr. et al. |
| 6,141,374 A | 10/2000 | Burns |
| 6,157,619 A | 12/2000 | Ozluturk et al. |
| 6,172,994 B1 | 1/2001 | Schaffner |
| 6,173,162 B1 | 1/2001 | Dahlman et al. |
| 6,181,949 B1 | 1/2001 | Ozluturk et al. |
| 6,195,327 B1 | 2/2001 | Lysejko et al. |
| 6,212,174 B1 | 4/2001 | Lomp et al. |
| 6,212,399 B1 | 4/2001 | Kumar et al. |
| 6,212,566 B1 | 4/2001 | Vanhoof et al. |
| 6,215,778 B1 | 4/2001 | Lomp et al. |
| 6,215,814 B1 | 4/2001 | Ylitalo et al. |
| 6,226,316 B1 | 5/2001 | Schilling et al. |
| 6,229,843 B1 | 5/2001 | Lomp et al. |

(56) References Cited

U.S. PATENT DOCUMENTS

| | | |
|---|---|---|
| 6,240,083 B1 | 5/2001 | Wright et al. |
| 6,252,866 B1 | 6/2001 | Haim |
| 6,269,113 B1 | 7/2001 | Park |
| 6,272,168 B1 | 8/2001 | Lomp et al. |
| 6,286,040 B1 | 9/2001 | Durham |
| 6,289,040 B1 | 9/2001 | Molev-Shteiman |
| 6,292,519 B1 | 9/2001 | Popovic |
| 6,324,208 B1 | 11/2001 | Bhagalia et al. |
| 6,335,923 B2 | 1/2002 | Kubo et al. |
| 6,335,924 B1 | 1/2002 | Yano et al. |
| 6,341,143 B1 | 1/2002 | Nelson et al. |
| 6,347,083 B1 | 2/2002 | Nishino |
| 6,356,555 B1 | 3/2002 | Rakib et al. |
| 6,381,264 B1 | 4/2002 | Lomp et al. |
| 6,393,049 B1 | 5/2002 | Davidovici et al. |
| 6,396,817 B2 | 5/2002 | Tiedemann, Jr. et al. |
| 6,396,867 B1 | 5/2002 | Tiedemann, Jr. et al. |
| 6,396,897 B1 | 5/2002 | Ebrahimifard et al. |
| 6,397,070 B1 | 5/2002 | Black |
| 6,405,272 B1 | 6/2002 | Regis |
| 6,434,124 B1 | 8/2002 | Rege |
| 6,438,119 B1 | 8/2002 | Kim et al. |
| 6,456,608 B1 | 9/2002 | Lomp |
| 6,463,089 B1 | 10/2002 | Chauncey et al. |
| 6,463,295 B1 | 10/2002 | Yun |
| 6,473,447 B1 | 10/2002 | Strich et al. |
| 6,487,190 B1 | 11/2002 | Regis |
| 6,490,462 B2 | 12/2002 | Ozluturk et al. |
| 6,493,563 B1 | 12/2002 | Ozluturk et al. |
| 6,507,745 B2 | 1/2003 | Ozluturk et al. |
| 6,510,148 B1 | 1/2003 | Honkasalo |
| 6,519,277 B2 | 2/2003 | Eidson |
| 6,519,461 B1 | 2/2003 | Andersson et al. |
| 6,519,474 B2 | 2/2003 | Ozluturk et al. |
| 6,539,008 B1 | 3/2003 | Ahn et al. |
| 6,546,058 B1 | 4/2003 | Gilhousen et al. |
| 6,549,525 B2 | 4/2003 | Odenwalder |
| 6,549,565 B1 | 4/2003 | Buehrer et al. |
| 6,571,105 B2 | 5/2003 | Ozluturk et al. |
| 6,575,368 B1 | 6/2003 | Tamburrini et al. |
| 6,577,876 B2 | 6/2003 | Ozluturk et al. |
| 6,587,447 B1 | 7/2003 | Wang et al. |
| 6,590,883 B1 | 7/2003 | Kitade et al. |
| 6,590,889 B1 | 7/2003 | Preuss et al. |
| 6,606,503 B2 | 8/2003 | Ozluturk et al. |
| 6,608,825 B1 | 8/2003 | Luddy |
| 6,633,600 B2 | 10/2003 | Lomp et al. |
| 6,654,613 B1 | 11/2003 | Maeng et al. |
| 6,661,835 B1 | 12/2003 | Sugimoto |
| 6,671,266 B1 | 12/2003 | Moon et al. |
| 6,674,788 B2 | 1/2004 | Lomp et al. |
| 6,674,791 B2 | 1/2004 | Lomp et al. |
| 6,697,350 B2 | 2/2004 | Lomp |
| 6,707,805 B2 | 3/2004 | Ozluturk et al. |
| 6,708,041 B1 | 3/2004 | Butovitsch et al. |
| 6,721,301 B2 | 4/2004 | Ozluturk et al. |
| 6,724,740 B1 | 4/2004 | Choi et al. |
| RE38,523 E | 6/2004 | Ozluturk |
| 6,744,809 B2 | 6/2004 | Lomp et al. |
| 6,760,321 B2 | 7/2004 | Shamsunder |
| 6,763,244 B2 | 7/2004 | Chen et al. |
| 6,766,143 B1 | 7/2004 | Beckwith |
| 6,778,511 B1 | 8/2004 | Magnus et al. |
| 6,778,551 B1 | 8/2004 | Oh |
| 6,778,840 B2 | 8/2004 | Ozluturk et al. |
| 6,785,251 B2 | 8/2004 | Bolgiano et al. |
| 6,788,662 B2 | 9/2004 | Ozluturk et al. |
| 6,801,516 B1 | 10/2004 | Lomp et al. |
| 6,816,473 B2 | 11/2004 | Ozluturk et al. |
| 6,831,905 B1 | 12/2004 | Lomp et al. |
| 6,839,567 B2 | 1/2005 | Ozluturk et al. |
| 6,847,821 B1 | 1/2005 | Lewis et al. |
| 6,850,499 B2 | 2/2005 | Wheatley et al. |
| 6,853,675 B1 | 2/2005 | Oleynik |
| 6,865,168 B1 | 3/2005 | Sekine |
| 6,873,645 B2 | 3/2005 | Lomp et al. |
| 6,879,841 B2 | 4/2005 | Ozluturk et al. |
| 6,885,652 B1 | 4/2005 | Ozukturk et al. |
| 6,904,294 B2 | 6/2005 | Ozluturk et al. |
| 6,907,020 B2 | 6/2005 | Periyalwar |
| 6,940,840 B2 | 9/2005 | Ozluturk et al. |
| 6,956,835 B2 | 10/2005 | Tong et al. |
| 6,973,579 B2 | 12/2005 | Dick et al. |
| 6,975,672 B2 | 12/2005 | Bottomley et al. |
| 6,977,915 B2 | 12/2005 | Chen et al. |
| 6,983,009 B2 | 1/2006 | Lomp |
| 6,985,467 B2 | 1/2006 | Lomp et al. |
| 7,010,320 B2 | 3/2006 | Komatsu |
| 7,020,111 B2 | 3/2006 | Ozluturk et al. |
| 7,039,029 B2 | 5/2006 | Lee et al. |
| 7,050,481 B1 | 5/2006 | Hulbert |
| 7,061,888 B2 | 6/2006 | Sakoda |
| 7,072,380 B2 | 7/2006 | Ozluturk et al. |
| 7,079,522 B1 | 7/2006 | Kim et al. |
| 7,085,583 B2 | 8/2006 | Ozluturk et al. |
| 7,117,004 B2 | 10/2006 | Ozluturk et al. |
| 7,123,600 B2 | 10/2006 | Ozluturk et al. |
| 7,123,607 B2 | 10/2006 | Yokoyama et al. |
| 7,133,460 B2 | 11/2006 | Bae et al. |
| 7,184,426 B2 | 2/2007 | Padovani et al. |
| 7,190,966 B2 | 3/2007 | Ozluturk et al. |
| 7,212,820 B2 | 5/2007 | Dent et al. |
| 7,233,591 B2 | 6/2007 | Holtzman et al. |
| 7,286,847 B2 | 10/2007 | Ozluturk et al. |
| RE39,980 E | 1/2008 | Dent |
| 7,339,894 B2 | 3/2008 | Corazza |
| 7,403,508 B1 | 7/2008 | Miao |
| 7,420,945 B2 | 9/2008 | Ponnekanti |
| 7,430,257 B1 | 9/2008 | Shattil |
| 7,437,177 B2 | 10/2008 | Ozluturk et al. |
| 7,502,406 B2 | 3/2009 | Lomp et al. |
| 7,535,874 B2 | 5/2009 | Ozluturk et al. |
| 7,583,225 B2 | 9/2009 | Cohen et al. |
| 7,593,453 B2 | 9/2009 | Lomp et al. |
| 7,656,931 B2 | 2/2010 | Smith et al. |
| 7,706,332 B2 | 4/2010 | Ozluturk et al. |
| 7,706,830 B2 | 4/2010 | Ozluturk et al. |
| 7,756,190 B2 | 7/2010 | Lomp et al. |
| 7,839,960 B2 | 11/2010 | Gilhousen et al. |
| 7,873,328 B2 | 1/2011 | Ozluturk et al. |
| 7,903,613 B2 | 3/2011 | Ozluturk et al. |
| 7,929,498 B2 | 4/2011 | Ozluturk et al. |
| 7,986,749 B2 | 7/2011 | Tiedemann, Jr. et al. |
| 8,009,636 B2 | 8/2011 | Ozluturk et al. |
| 8,208,513 B2 | 6/2012 | Amde et al. |
| 8,213,485 B2 | 7/2012 | Odenwalder |
| 8,248,912 B2 | 8/2012 | Chen et al. |
| 8,285,318 B2 | 10/2012 | Chen et al. |
| 2001/0038630 A1 | 11/2001 | Tong et al. |
| 2002/0051434 A1 | 5/2002 | Ozluturk et al. |
| 2002/0057659 A1 | 5/2002 | Ozluturk et al. |
| 2002/0097697 A1 | 7/2002 | Bae et al. |
| 2002/0101832 A1 | 8/2002 | Chen et al. |
| 2002/0118653 A1 | 8/2002 | Lomp et al. |
| 2002/0131376 A1 | 9/2002 | Wheatley et al. |
| 2002/0150065 A1 | 10/2002 | Ponnekanti |
| 2003/0190925 A1 | 10/2003 | Ozluturk et al. |
| 2003/0193915 A1 | 10/2003 | Lee et al. |
| 2004/0005020 A1 | 1/2004 | Dent |
| 2004/0071198 A1 | 4/2004 | Lomp et al. |
| 2004/0136321 A1 | 7/2004 | Ren et al. |
| 2004/0165654 A1 | 8/2004 | Lomp et al. |
| 2004/0179506 A1 | 9/2004 | Padovani et al. |
| 2004/0233867 A1 | 11/2004 | Wheatley, III et al. |
| 2004/0252668 A1 | 12/2004 | Ozukturk et al. |
| 2005/0002348 A1 | 1/2005 | Holtzman et al. |
| 2005/0094604 A1 | 5/2005 | Ozluturk et al. |
| 2005/0243897 A1 | 11/2005 | Lomp et al. |
| 2005/0249165 A1 | 11/2005 | Ozluturk et al. |
| 2005/0254478 A1 | 11/2005 | Ozluturk et al. |
| 2005/0265430 A1 | 12/2005 | Ozluturk et al. |
| 2006/0088134 A1 | 4/2006 | Gilhousen et al. |
| 2006/0098759 A1 | 5/2006 | Tiedemann, Jr. et al. |
| 2007/0002934 A1 | 1/2007 | Schilling |

(56) References Cited

U.S. PATENT DOCUMENTS

| | | |
|---|---|---|
| 2007/0025319 A1 | 2/2007 | Padovani et al. |
| 2007/0294686 A1 | 12/2007 | Oh |
| 2008/0024046 A1 | 1/2008 | Juan |
| 2008/0304552 A1 | 12/2008 | Pataguppe et al. |
| 2009/0310651 A1 | 12/2009 | Amde et al. |
| 2010/0002752 A1 | 1/2010 | Lomp et al. |
| 2010/0157950 A1 | 6/2010 | Ozluturk et al. |
| 2010/0272155 A1 | 10/2010 | Lomp et al. |
| 2010/0277878 A1 | 11/2010 | Sekido |
| 2011/0113232 A1 | 5/2011 | Westmeijer |
| 2011/0158202 A1 | 6/2011 | Ozukturk et al. |
| 2011/0194571 A1 | 8/2011 | Ozluturk et al. |
| 2012/0008598 A1 | 1/2012 | Ozluturk et al. |
| 2014/0348135 A1 | 11/2014 | Ozluturk et al. |
| 2015/0089105 A1 | 3/2015 | Lu et al. |

FOREIGN PATENT DOCUMENTS

| | | |
|---|---|---|
| CA | 2153516 | 6/1999 |
| CA | 2118615 | 9/1999 |
| CA | 2072989 | 1/2002 |
| DE | 3150474 | 9/1982 |
| DE | 3305115 | 8/1983 |
| DE | 3700492 | 7/1987 |
| DE | 3743731 | 7/1989 |
| DE | 3743732 | 7/1989 |
| EP | 0022170 | 1/1981 |
| EP | 0360476 | 3/1990 |
| EP | 0372350 | 6/1990 |
| EP | 0372350 A2 | 6/1990 |
| EP | 0462572 | 12/1991 |
| EP | 0464839 | 1/1992 |
| EP | 0476215 | 3/1992 |
| EP | 0515335 | 5/1992 |
| EP | 0505341 | 9/1992 |
| EP | 0525860 | 2/1993 |
| EP | 0526106 | 2/1993 |
| EP | 0531028 A2 | 3/1993 |
| EP | 0564825 A2 | 10/1993 |
| EP | 0565507 | 10/1993 |
| EP | 0610030 A2 | 8/1994 |
| EP | 0615395 | 9/1994 |
| EP | 0615395 A1 | 9/1994 |
| EP | 0631397 | 12/1994 |
| EP | 0637179 | 2/1995 |
| EP | 0265178 B1 | 4/1995 |
| EP | 0654913 | 5/1995 |
| EP | 0656716 | 6/1995 |
| EP | 0668662 | 8/1995 |
| EP | 0668665 A1 | 8/1995 |
| EP | 0678991 A2 | 10/1995 |
| EP | 0682423 | 11/1995 |
| EP | 0682423 A2 | 11/1995 |
| EP | 0719062 A2 | 6/1996 |
| EP | 0744876 | 11/1996 |
| EP | 0744876 A2 | 11/1996 |
| EP | 0748061 A3 | 1/1998 |
| EP | 0515610 B1 | 8/1998 |
| EP | 0993128 A1 | 4/2000 |
| EP | 0514539 B1 | 7/2000 |
| EP | 0607359 B1 | 4/2001 |
| EP | 0639896 B1 | 7/2001 |
| EP | 0688479 B1 | 7/2001 |
| EP | 0565505 B1 | 8/2001 |
| EP | 0669068 B1 | 9/2001 |
| EP | 0590135 B1 | 10/2001 |
| EP | 0683570 B1 | 11/2001 |
| EP | 0777933 B1 | 11/2001 |
| EP | 0697163 B1 | 6/2002 |
| EP | 0895676 B1 | 7/2002 |
| EP | 0715423 B1 | 10/2002 |
| EP | 0650304 B1 | 12/2002 |
| EP | 0500689 B2 | 3/2003 |
| EP | 0847634 B1 | 4/2003 |
| EP | 0668665 B1 | 5/2003 |
| EP | 0693830 B1 | 5/2003 |
| EP | 0682419 b1 | 7/2003 |
| EP | 0680160 B1 | 2/2004 |
| EP | 0682417 B1 | 2/2004 |
| EP | 0774179 B1 | 6/2004 |
| EP | 0903019 B1 | 1/2005 |
| EP | 0903023 B1 | 4/2005 |
| EP | 0584241 | 9/2005 |
| EP | 1772969 A3 | 4/2007 |
| EP | 0827675 B1 | 6/2008 |
| EP | 1933470 | 6/2008 |
| EP | 0682418 B9 | 9/2010 |
| FR | 2712129 | 5/1995 |
| GB | 2187367 A | 9/1987 |
| GB | 2229609 A | 9/1990 |
| GB | 2280575 | 2/1995 |
| GB | 2301746 | 12/1996 |
| JO | H06-177853 | 6/1994 |
| JP | S61-129963 | 6/1986 |
| JP | S61-170059 | 7/1986 |
| JP | S62-030444 | 2/1987 |
| JP | S62-256516 | 11/1987 |
| JP | S63-074240 | 4/1988 |
| JP | S63-198423 | 8/1988 |
| JP | S63-226151 | 9/1988 |
| JP | S64-047141 | 2/1989 |
| JP | S64-062045 | 3/1989 |
| JP | H01-124730 | 8/1989 |
| JP | H02-042500 | 2/1990 |
| JP | H02-84832 | 3/1990 |
| JP | H02-220526 | 9/1990 |
| JP | H02-256331 | 10/1990 |
| JP | H02-280575 | 11/1990 |
| JP | H02-287874 | 11/1990 |
| JP | H02-291737 | 12/1990 |
| JP | H02-301746 | 12/1990 |
| JP | H03-32122 A | 2/1991 |
| JP | H03-040535 | 2/1991 |
| JP | H03-231523 | 10/1991 |
| JP | H04-114521 | 4/1992 |
| JP | H04-222111 | 8/1992 |
| JP | H04-287593 | 10/1992 |
| JP | H05-022285 | 1/1993 |
| JP | H05-083381 | 4/1993 |
| JP | H05-129969 | 5/1993 |
| JP | H05-144128 | 6/1993 |
| JP | H05-160861 A | 6/1993 |
| JP | H07-030483 | 7/1993 |
| JP | H05-206927 | 8/1993 |
| JP | H05-219129 | 8/1993 |
| JP | H06-268628 | 8/1993 |
| JP | 5-227124 | 9/1993 |
| JP | H05-235906 | 9/1993 |
| JP | H05-244056 | 9/1993 |
| JP | H05-327580 | 10/1993 |
| JP | H05-300077 | 11/1993 |
| JP | H06-006374 | 1/1994 |
| JP | 1994-066974 | 3/1994 |
| JP | H06-069898 | 3/1994 |
| JP | H06-77963 | 3/1994 |
| JP | H06-085731 | 3/1994 |
| JP | H06-104694 | 4/1994 |
| JP | H06-104829 | 4/1994 |
| JP | H06-120865 | 4/1994 |
| JP | H06-132871 | 5/1994 |
| JP | H06-132872 | 5/1994 |
| JP | H06-133351 | 5/1994 |
| JP | H06-224880 | 8/1994 |
| JP | 06-268574 | 9/1994 |
| JP | H06-252797 | 9/1994 |
| JP | H06-276176 | 9/1994 |
| JP | H06-311194 | 11/1994 |
| JP | H06-334588 | 12/1994 |
| JP | H06-343068 | 12/1994 |
| JP | H07-023022 | 1/1995 |
| JP | H07-046180 | 2/1995 |
| JP | H07-050631 | 2/1995 |
| JP | 07-058690 | 3/1995 |
| JP | 07-502631 | 3/1995 |

(56) References Cited

FOREIGN PATENT DOCUMENTS

| | | |
|---|---|---|
| JP | H07-058665 | 3/1995 |
| JP | H07-079477 | 3/1995 |
| JP | H07-087011 | 3/1995 |
| JP | H07-095151 | 4/1995 |
| JP | H07-107007 | 4/1995 |
| JP | H07-107033 | 4/1995 |
| JP | 7131551 A2 | 5/1995 |
| JP | H07-123016 | 5/1995 |
| JP | H07-154297 | 6/1995 |
| JP | H07-38496 | 7/1995 |
| JP | H07-170223 | 7/1995 |
| JP | H07-226709 | 8/1995 |
| JP | H07-273600 | 10/1995 |
| JP | H07-336323 | 12/1995 |
| JP | H07-336765 | 12/1995 |
| JP | H08-32513 | 2/1996 |
| JP | H08-37515 | 2/1996 |
| JP | H08-122474 | 5/1996 |
| JP | H08-125604 | 5/1996 |
| JP | H08-166480 | 6/1996 |
| JP | 08-272722 | 10/1996 |
| JP | H08-288881 | 11/1996 |
| JP | H08-307320 | 11/1996 |
| JP | S63-23425 | 1/1998 |
| JP | H10-210541 | 8/1998 |
| JP | 2000-022170 | 1/2000 |
| JP | 2001-166841 | 6/2001 |
| WO | 9013942 | 11/1990 |
| WO | 91/07037 | 5/1991 |
| WO | 9200639 | 1/1992 |
| WO | 9222157 | 10/1992 |
| WO | 9221196 | 11/1992 |
| WO | 92/22161 | 12/1992 |
| WO | 9222166 A1 | 12/1992 |
| WO | 9306550 A1 | 4/1993 |
| WO | 9307702 | 4/1993 |
| WO | 9308435 A1 | 4/1993 |
| WO | 9309626 | 5/1993 |
| WO | 93/14588 | 7/1993 |
| WO | 9314588 | 7/1993 |
| WO | 9315502 A1 | 8/1993 |
| WO | 9315573 | 8/1993 |
| WO | 93/17507 | 9/1993 |
| WO | 93/20629 | 10/1993 |
| WO | 93/21739 | 10/1993 |
| WO | 94/00927 | 1/1994 |
| WO | 9401943 | 1/1994 |
| WO | 94/06217 | 3/1994 |
| WO | 9408418 A1 | 4/1994 |
| WO | 94/13069 | 6/1994 |
| WO | 9412962 A1 | 6/1994 |
| WO | 9413066 A1 | 6/1994 |
| WO | 9416513 | 7/1994 |
| WO | 94/18756 | 8/1994 |
| WO | 9418799 A1 | 8/1994 |
| WO | 9423491 A1 | 10/1994 |
| WO | 9428640 | 12/1994 |
| WO | 9501018 A1 | 1/1995 |
| WO | 9501032 A1 | 1/1995 |
| WO | 9503549 A1 | 2/1995 |
| WO | 9503652 | 2/1995 |
| WO | 9506365 A1 | 3/1995 |
| WO | 9507578 | 3/1995 |
| WO | 9508876 | 3/1995 |
| WO | 9508888 A1 | 3/1995 |
| WO | 95/12297 | 5/1995 |
| WO | 95/12930 | 5/1995 |
| WO | 95/12938 | 5/1995 |
| WO | 9512257 | 5/1995 |
| WO | 9512262 A1 | 5/1995 |
| WO | 9512296 A1 | 5/1995 |
| WO | 9512919 A1 | 5/1995 |
| WO | 9512943 A1 | 5/1995 |
| WO | 9514345 A1 | 5/1995 |
| WO | 9514347 A1 | 5/1995 |
| WO | 9514356 A2 | 5/1995 |
| WO | 9514357 A1 | 5/1995 |
| WO | 9514358 A1 | 5/1995 |
| WO | 9514359 | 5/1995 |
| WO | 9515038 | 6/1995 |
| WO | 95/19664 | 7/1995 |
| WO | 95/23464 | 8/1995 |
| WO | 95/24102 | 9/1995 |
| WO | 95/33313 | 12/1995 |
| WO | 96/02097 | 1/1996 |
| WO | 96/03813 | 2/1996 |
| WO | 96/31014 | 10/1996 |
| WO | 96/37079 | 11/1996 |
| WO | 9702665 | 1/1997 |
| WO | 9702675 | 1/1997 |
| WO | 9707600 | 2/1997 |
| WO | 97/37457 | 10/1997 |
| WO | 97/45970 | 12/1997 |

OTHER PUBLICATIONS

Andermo et al., "A CDMA-Based Radio Access Design for UMTS," *IEEE Personal Communications*, pp. 48-53, (Feb. 1995).

Andermo et al., "Code Division Testbed, CODIT," *Record*, ICUPC'93 Conference, pp. 397-401, (IEEE 1993).

Andermo et al., "CODIT, a Testbed Project Evaluating DS-CDMA for UMTS/FPLMTS," pp. 21-25, IEEE (1994).

Andermo, "CODIT Final Review Report," R2020/ERA/PM/DS/P/050/b1, Issue 2.0, *UMTS Code Division Testbed (CODIT)*, (Nov. 21, 1995).

Association of Radio Industries for 3G Mobile System, and Businesses (ARIB), *Specifications of Air-Interface for 3G Mobile System*, vol. 3, ver. 1.0, (Jan. 14, 1999).

Azad et al.,"Multirate Spread Spectrum Direct Sequence CDMA Techniques", *IEEE Colloquium on Spread Spectrum Techniques for Radio Communication Systems*, Digest No. 1994/ 098, pp. 4/1-4/5, (IEEE, 1994).

Baier et al., "Design Study for A CDMA Based Third Generation Mobile Radio System," *IEEE Journal on Selected Areas In Communications*, vol. 12, No. 4, pp. 733-743, (May 1994).

Bernasoni, "Receiver Architectures for the Down-Link in a DS-CDMA Mobile System," pp. 51-55 (IEEE, Sep. 1994).

Van Nielen, "UMTS: A Third Generation Mobile System," *PIMRC '92*, (Boston, MA, Oct. 19-21, 1992) pp. 17-21, (1992).

Ziemer et al., *Digital Communications and Spread Spectrum Systems*, pp. 492-494 (Collier Macmillan 1985).

Zimmerman et al., "CDMA und ATM-zwei Technologien, ein Zeil, (CDMA and ATM—Ideal Partners )" *2323 Telecom Report Siemens*, vol. 18, No. 2, pp. 60-63, (1995 Maerz/April, München, DE) , from http://www.siemens.de/telcom/artikel/0295/295zimm.htm Translation provided in: *Siemens Telcom Report International* from http://www.siemens.de/telcom/articles/e0395/395zimm.htm.

In the Matter of Certain 3G Mobile Handsets and Components, Investigation No. 337-TA-613 (Aug. 14, 2009).

Association of Radio Industries and Businesses (ARIB), *Specifications of Air-Interface for 3G Mobile System*, vol. 3, ver. 1.0, (Jan. 14, 1999).

Blasbalg, "A Comparison of Pseudo-Noise and Conventional Modulation for Multiple-Access Satellite Communications," *IBM Journal*, pp. 241-255, (Jul. 1965).

Braun et al., "An All-Digital Receiver for Satellite Audio Broadcasting Signals Using Trellis Coded Quasi-Orthogonal Code-Division Multiplexing," *European Transactions on Telecommunications and Related Technologies*, vol. 4, No. 1, pp. 23-32, (Feb. 1993).

Cosmas et al., "Overview of the Mobile Communications Programme of RACE II," *Electronics and Communication Engineering Journal*, pp. 155-167,(Aug. 1995).

Dixon, *Spread Spectrum Systems With Commercial Applications, Third Edition*, pp. 412-415, (John Wiley & Sons, Inc. 1994).

Esmailzadeh et al., "Power Control in Packet Switched Time Division Duplex Direct Sequence Spread Spectrum Communications," *Vehicular Technology Conference, 1992 IEEE 42nd*, vol. 2, pp. 989-992, (May 10-13, 1992).

(56) References Cited

OTHER PUBLICATIONS

ETSI TC-RES, European Telecommunication Standard ETS 300 444, "Radio Equipment and Systems (RES); Digital European Cordless Telecommunications (DECT) Generic Access Profile (GAP)," (European Telecommunication Standards Institute, Dec. 1995).

Cosmas et al., "Overview of the Mobile Communications Programme of RACE II" *Electronics and Communication Engineering Journal*, pp. 155-167,(Aug. 1995).

ETSI TC-RES, European Telecommunication Standard prETS 300 444, "Radio Equipment and Systems (RES); Digital European Cordless Telecommunications (DECT) Generic Access Profile (GAP)," (European Telecommunication Standards Institute, Feb. 1995).

Expert Report of Mark Lanning Regarding Invalidity of U.S. Patent Numbers: 6,674,791; 7,117,004; 7,190,966; and 7,286,847, In the Matter of Certain 3G Mobile Handsets And Components, Investigation No. 337-TA-613, Feb. 1, 2008.

Expert Report of Mark Lanning Regarding Invalidity of U.S. Patent Numbers: 6,674,791 and 7,190,966, In the Matter of Certain 3G Mobile Handsets And Components Thereof, Investigation No. 337-TA-601, Oct. 17, 2007.

Fluhr et al, "Advanced Mobile Phone Service: Control Architecture," *The Bell System Technical Journal*, vol. 58, No. 1, pp. 43-69, (American Telephone and Telegraph Company Jan. 1979).

Hagmanns et al., "Code Division Multiple Access (CDMA): das natürliche Zugriffesverfahren für den zellularen Mobilfunk (Code Division Multiple Access (CDMA): The Natural Access Procedure for Cellular Mobile Radio Systems)," 8273 ANT Nachrichtentechnische Berichte, No. 10, pp. 64-71, (Aug. 1993, Backnang, DE). Translation of paper provided, pp. 1-17.

I et al., "Performance of Multi-Code CDMA Wireless Personal Communications Networks", pp. 907-911, (IEEE, 1995).

I et al., "Variable Spreading Gain CDMA with Adaptive Control for True Packet Switching Wireless Network", pp. 725-730, (IEEE, 1995).

Interdigital / Siemens, "Functional Interface Specification (FIS) for Radio in the Local Loop based on B-CDMA, CDMAlink version 1," Issue 1.0 (Siemens AG Jun. 23, 1995).

Kohno et al., "Spread Spectrum Access Methods for Wireless Communications," *IEEE Communications*, vol. 33, No. 1, pp. 58-67, (IEEE, Jan. 1995).

Krzymien et al., "Rapid Acquisition Algorithms for Synchronization of Bursty Transmissions in CDMA Microcellular and Personal Wireless Systems", *IEEE Journal on Selected Areas in Communications*, vol. 14, No. 3, pp. 570-579, (Apr. 1996).

Lee, "Overview of Cellular CDMA," *IEEE Transactions on Vehicular Technology*, vol. 40, No. 2, pp. 291-302, (May 1991).

Liu et al., "SIR-Based Call Admission Control for DS-CDMA Cellular Systems," *IEEE Journal on Selected Areas in Communications*, vol. 12, No. 14, pp. 638-644 (May 1994).

McEliece, R. J., "Correlation Properties of Sets of Sequences Derived From Irreducible Cyclic Codes," *Information and Control 45*, pp. 18-25 (1980).

MPT 1375, Common Air Interface Specification to be Used for the Interworking between Cordless Telephone Apparatus (May 1989).

Ormondroyd, "Power Control for Spread-Spectrum Systems," *Conference on Communications Equipment and Systems*, pp. 109-115, (Apr. 20-22, 1982).

Qualcomm, "Proposed EIA/TIA Interim Standard: Wideband Spread Spectrum Digital Cellular System Dual-Mode Mobile Station—Base Station Compatibility Standard," TR45.5, (Apr. 21, 1992).

Rick et al., "Noncoherent Parallel Acquisition in CDMA Spread Spectrum Systems," IEEE, pp. 1422-1426, (May 1994).

Salmasi et al., "On The System Design Aspects Of Code Division Multiple Access (CDMA) Applied to Digital Cellular And Personal Communications Networks," *Vehicular Technology Conference, 1991. 'Gateway to the Future Technology in Motion', 41st IEEE*, pp. 57-62, (May 19-22, 1992).

Schilling, "Broadband-CDMA: *ONEPHONE* for A Wireless Twenty First Century," ICPWC'94, pp. 1-5, (IEEE 1994).

Siemens AG, "CDMA / link System Description," ver. 3.00 (Mar. 10, 1995).

Simpson et al., "Direct Sequence CDMA Power Control, Interleaving and Coding,"*IEEE Journal on Selected Areas In Communications*, vol. 11, No. 7, pp. 1085-1095, (Sep. 1993).

Soliman et al., "CDMA Reverse Link Open Loop Power Control," *Globecom '92 IEEE Global Telecommunications Conference* (Orlando, FL, Dec. 6-9, 1992) pp. 69-73, (IEEE 1992).

Tachikawa et al., "Nonlinear Code Sequence for Rapid Acquisition—Ref. 3", Study Report of the Spread Spectrum Communication System Study Group, The Institute of Electrical, Information, Electronics and Communications Engineers of Japan (IEIEC), (Mar. 25, 1987). Translation provided.

Telecommunications Industry Association, TIA/EIA/IS-95-A (Revision of TIA/EIA/IS-95), "TIA/EIA Interim Standard: Mobile Station—Base Station Compatibility Standard for Dual-Mode Wideband Spread Spectrum Cellular System," (May 1995).

TIA/EIA/IS-95, "Mobile Station-Base Station Compatibility Standard for Dual-Mode Wideband Spread Spectrum Cellular System", TIA/EIA Interim Standard, pp. 7-12, 7.14, and 7.15, (Telecommunications Industry Association, Jul. 1993).

Tiedemann et al., "The Design and Development of A Code Division Multiple Access (CDMA) System for Cellular And Personal Communications,"*IEEE International Symposium on Personal, Indoor and Mobile Radio Communications*, (London, UK, Sep. 23-25, 1991) pp. 131-136, (IEEE 1991).

Zimmerman et al., "CDMA und ATM-zwei Technologien, ein Zeil, (CDMA and ATM—Ideal Partners )" *2323 Telecom Report Siemens*, vol. 18, No. 2, pp. 60-63, (1995 Maerz/April, München, DE), from http://www.siemens.de/telcom/artikel/0295/295zimm.htm Translation provided in: *Siemens Telcom Report International* from http://www.siemens.de/telcom/articles/e0395/395zimm.htm.

Cameron et al., "An Analysis of CDMA With Imperfect Power Control," *1993 43rd Vehicular Technology Conference*, (Seacaucus, NJ, May 18-20, 1993), pp. 977-979, (IEEE 1992).

Salmasi et al., "On The System Design Aspects Of Code Division Multiple Access (CDMA) Applied to Digital Cellular And Personal Communications Networks," *Vehicular Technology Conference, 1991. 'Gateway to the Future Technology in Motion', 41st IEEE*, pp. 57-62, (May 19-22, 1991).

Tiedemann et al., "The Design and Development of A Code Division Multiple Access (CDMA) System for Cellular And Personal Communications," *IEEE International Symposium on Personal, Indoor and Mobile Radio Communications*, (London, UK, Sep. 23-25, 1991) pp. 131-136, (IEEE 1991).

Zimmerman et al., "CDMA and ATM-zwei Technologien, ein Zeil, (CDMA and ATM—Ideal Partners )" *2323 Telecom Report Siemens*, vol. 18, No. 2, pp. 60-63, (1995 Maerz/April, München, DE), from http://www.siemens.de/telcom/artikel/0295/295zimm.htm Translation provided in: *Siemens Telcom Report International* from http://www.siemens.de/telcom/articles/e0395/395zimm.htm.

Ormondroyd, "Power Control for Spread-Spectrum Equipment and Systems," *Conference on Communications Equipment and Systems*, pp. 109-115, (Apr. 20-22, 1982).

"Final Initial and Recommended Determinations," In the Matter of Certain 3G Mobile Handsets and Components, United States International Trade Commission, Investigation No. 337-TA-613 (Aug. 14, 2009).

"Notice of Commission Determination to Review in Part A Final Determination Finding No Violation of Section 337 and on Review to Affirm the Administrative Law Jodge's Determination of No Violation; Termination of Investigation," In the Matter of Certain 3G Mobile Handsets and Components, Investigation No. 337-TA-613 (Oct. 16, 2009).

"Public Version of Respondents Samsung Electronics America, Inc.'s and Samsung Telecommunications America LLC's Response to the Complaint and Notice of Investigation," *In the Matter of Certain 3G Wideband Code Division Multiple Access (WCDMA) Handsets and Components Thereof*, (United States International Trade Commission), (Investigation No. 337-TA-601), (May 31, 2007).

(56) References Cited

OTHER PUBLICATIONS

Abeta et al, "A Coherent Detection System with a Suppressed Pilot Channel for DS/CDMA Systems," Technical Report of IEICE, B-II, vol. J77-B-II, No. 11, pp. 641-648, Japan, Nov. 1994.
Alavi, Power Control and Interference Management in a Spread-Spectrum Cellular Mobile Radio System, (1984) (unpublished Ph.D. thesis — Michigan State University Department of Electrical Engineering and Systems Science) (on file with the Michigan State University Libraries).
Andermo, et al., "A CDMA-Based Radio Access Design for UMTS," *IEEE Personal Communications*, pp. 48-53, (Feb. 1995).
Andermo et al., "Code Division Testbed, CODIT," *Record* ICUPC'93 Conference, pp. 397-401, (IEEE 1993).
Andermo et al, "Codit, a Tested Project Evaluating DS-CDMA for UMTS/FPLMTS," pp. 21-25, IEEE (1994).
Andermo, "CODIT Final Review Report, " R2020/ERA/PM/DS/P/050/f1, Issue 2.0, *UMTS Code Division Testbed (CODIT)*, (Nov. 21, 1995).
Association of Radio Industries and Businesses (ARIB), *Specifications of Air-Interface for 3G Mobile System*, vol. 3, ver. 1.0, (Jan. 14, 1995)
Azad et al., "Multirate Spread Spectrum Direct Sequence CDMA Techniques", *IEEE Colloquium on Spread Spectrum Techniques for Radio Communication Systems*, Digest No. 1994/098, pp. 4/1-4/5, (IEEE, 1994).
Baier et al., "Design Study for A CDMA Based Third Generation Mobile Radio System," *IEEE Journal on Selected Areas In Communications*, vol. 12, No. 4, pp. 733-734, (May 1994).
Bernasoni, "Receiver Architectures for the Down-Link in a DS-CDMA Mobile System," pp. 51-55. (IEEE, Sep. 1994).
Blahut, *Theory and Practice of Error Control codes*, (Addison-Wesley Publishing Company, 1983).
Blasbalg, "A Comparison of Pseudo-Noise and Conventional Modulation for Multiple-Access Satellite Communications," *IBM Journal*, pp.241-255, (Jul. 1965).
Braun et al., "An All-Digital Receiver for Satellite Audio Broadcasting Signals Using Trellis Coded Quasi-Orthogonal Code-Division Multiplexing," *European Transactions on Telecommunications and Related Technologies*, vol. 4, No. 1, pp. 23-32 (Feb. 1993).
Brismark et al., "A Coherent Detection Scheme for the Uplink Channel in a CDMA System," 1994 IEEE 44th Vehicular Technology Conference, Stockholm, Sweden, vol. 2, pp. 729-732 (Jun. 1994).
Cameron et al., "An Analysis of CDMA with Imperfect Power Control," *1993 43rd IEEE Vehicular Technology Conference*, (Seacaucus, NJ, May 18-20, 1993), pp. 977-979, (IEEE 1992).
Chuang et al., "Uplink Power Control for TDMA Portable Radio Channels," *IEEE Transactions on Vehicular Technology*, vol. 43, No. 1, pp. 33-39, (Feb. 1994).
Cosmas et al., "Overview of the Mobile Communications Programme of RACE II," *Electronics and Communication Engineering Journal*, pp. 155-167, (Aug. 1995).
D'Avella et al., "Power Control in CDMA Systems: Performance Evaluation and System Design Implications," Universal Personal Communications, 1994, Record, 1994 Third Annual International Conference On, , pp. 73-77 (Sep. 27-Oct. 1, 1994).
Dixon, *Spread Spectrums Systems With Commercial Applications, Third Edition*, pp. 412-415, (John Wiley & Sons, Inc. 1994).
Esmailzadeh et al., "Power Control in Packet Switched Time Division Duplex Direct Sequence Spread Spectrum Communications," *Vehicular Technology Conference, 1992 IEEE 42nd*, vol. 2, pp. 989-998, (May 10-13, 1992)
ETSI TC-RES, European Telecommunication Standard ETS 300 444, "Radio Equipment and Systems (RES); Digital European Cordless Telecommunications (DECT) General Access Profile (GAP)," (European Telecommincations Standards Institute, Dec. 1995).
ETSI TC-RES, European Telecommunication Standard ETS 300 444, "Radio Equipment and Systems (RES); Digital European Cordless Telecommunications (DECT) General Access Profile (GAP)," (European Telecommincations Standards Institute, Feb. 1995).
ETSI TC-RES, Interim European Telecommunication Standard (I-ETS) 300 131, "Radio Equipment and Systems (RES); Common Air Interface Specification to be used for the interworking between cordless telephone apparatus in the frequency band 864, 1 MHz to 868,1 MHz, including public services," (European Telecommunication Standards Institute, Apr. 1992).
Etsi TC-SMG, European Telecommunication Standard ETS 300 578, "Digital Cellular Telecommunications System (Phase 2); Radio Subsystem Link Control (GSM 05.08)", Fifth Edition (European Telecommunications Standards Institute, May 1996).
Expert Report of Mark Lanning Regarding Invalidity of U.S. Pat. No. 6,674,791 and 7,190,966, in the Matter of Certain 3G Mobile Handsets and Components Thereof, Investigation No. 337-TA-601, Oct. 17, 2007.
Fluhr et al, "Advanced Mobile Phone Service: Control Architecture," *The Bell System Technical Journal* vol. 58, No. 1, pp. 43-69, (American Telephone and Telegraph Company Jan. 1979).
Giannetti et al., "Design of an All-Digital Receiver for Narrowband Continuous-Phase Asynchronous CDMA Systems," vol. 3, pp. 468-472 (IEEE, May 1993).
Hagmanns et al., "Code Division Multiple Access (CDMA): das natürliche Zugriffesverfahren für den zellularen Mobilfunk (Code Division Multiple Access (CDMA): The Natural Access Procedure for Cellular Mobile Radio Systems)," 8273 ANT Nachrichtentechnische Berichte, No. 10, pp, 64-71, (Aug. 1993, Backnang, DE). Translation of paper provided, pp. 1-17.
Hinderling et al., "CDMA Mobile Station Modem ASIC," *IEEE Journal of Solid State Circuits*, vol. 28, No. 3, pp. 253-260, (Mar. 1993).
Hinderling et al, "Digital automobile/mobile telephone type CDMA modulation demodulation circuits integrated into a chip," Nikkei Electronics, Apr. 26 issue, No. 579, pp. 163-175, Nikkei Business Publications, Inc. (Apr. 26, 1993) (Not available in English).
Holtzman, "A Simple, Accurate Method to Calculate Spread-Spectrum Multiple-Access Error Probabilities," *IEEE Transactions on Communications*, vol. 40, No. 3, pp. 461-464, (IEEE, Mar. 1992).
I et al., "Multi-Code CDMA Wireless Personal Communications Networks," pp. 1060-1064, (IEEE, 1995).
I et al., "Performance of Multi-Code CDMA Wireless Personal Communications Networks", pp. 907-911, (IEEE, 1995)
I et al, "Variable Spreading Gain CDMA with Adaptive Control for True Packet Switching Wireless Network", pp. 725-730, (IEEE, 1995).
Interdigital/Siemens, "Functional Interface Specification (FIS) for Radio in the Local Loop based on B-CDMA, CDMA*link* version 1," Issue 1.0 (Siemens AG Jun. 23, 1995).
International Dictionary of Physics and Electronics, Second Edition, pp. 612 and 952, (D. Van Nostrand Company, Inc., 1956, 1961).
Kato et al., An improvement on channel quality for personal communications systems, Proceedings of General Conference 1995 of the Institute of Electronics, Information and Communication Engineers, Communication 1, p. 513, B513, (Mar. 10, 1995).
Kohno et al., "Spread Spectrum Access Methods for Wireless Communications," *IEEE Communications*, vol. 33, No. 1, pp.58-67, (IEEE, Jan. 1995).
Komo et al., "Implementation Consideration of Code Division Multiple Access Sequences," 23$^{RD}$ *Southeastern Symposium on System Theory*, pp. 11-15, (Mar. 12, 1991).
Krzymien et al., "Rapid Acquisition Algorithms for Synchronization of Bursty Transmissions in CDMA Microcellular and Personal Wireless Systems", *IEEE Journal on Selected Areas in Communications*, vol. 14, No. 3, pp. 570-579, (Apr. 1995).
Lee, "Overview of Cellular CDMA, " *IEEE Transactions on Vehicular Technology*, col. 40, No. 2, pp. 291-302, (May 1991).
Liu et al., "SIR-Based Call Admission Control for DS-CDMA Cellular Systems," *IEEE Jounral on Selected Areas in Communications*, vol.12, No. 14, pp. 638-644 (May 1994).
McDonald, *Fundamentals of Digital Switching*, (Plenum Press, 1983).

(56) References Cited

OTHER PUBLICATIONS

McEleiece, R.J., "Correlation Properties of Sets of Sequences Derived from Irreducible Cyclic Codes," *Information and Control* 45, pp. 18-25 (1980).

McFarlane et al., "Validation of Advanced CDMA Concepts for UMTS and FPLMTS," pp. 36-40, (IEEE 1994).

McFarlane, "UMTS Revisited," (IEE, London, UK 1994).

MPT 1375, Cmmon Air Interface Specification to be Used for the Interworking between Cordless Telephone Apparatus (May 1989).

Nettleton, Spectral Efficiency in Cellular Land-Mobile Communications: A Spread Spectrum Approach, (1978) (unpublished Ph.D. thesis, Purdue University) (on file with UMI Dissertation Information Service).

Okazaki et al., "Transmission Power Control Method for Wide-band DS/CDMA Transmission," Proceedings of the 1995 IEICE General Conference, [Communications 1], B-425, p. 425 (Mar. 10, 1995) (Not available in English).

Ormondroyd, "Power Control for Spread-Spectrum Systems," *Conference on Cmmunications Equipments and Systems*, pp.109-115, (Apr. 20-22, 1982).

Pahlavan et al., "Performance of Adaptive Matched Filter Receivers Over Fading Multipath Channels," *IEEE Transactions on Communications*, vol. 38, No. 12, pp. 2106-2113, (Dec. 1990).

Public Version of Respondents Nokia Corporation and Nokia Inc.'s Response to the Complaint and Notice of Investigation, In the Matter of Certain 3G Mobile Handsets and Components Thereof, Investigation No. 337-TA-613, Oct. 5, 2007.

Public Version of Respondents Nokia Corporation and Nokia Inc.'s Response to the Second Amended Complaint and Notice of Investigation, In the Matter of Certain 3G Mobile Handsets and Components Thereof, Investigation No. 337-TA-613, Dec. 31, 2007.

Pursley, "Performance Evaluation for Phase-Coded Spread-Spectrum Multiple-Access Communication—Part 1: System Analysis," *IEEE Transactions on Communications*, vol. COM-25, No. 8, pp. 795-799, (Aug. 1977).

Qualcomm, "Proposed EIA/TIA Interim Standard: Wideband Spread Spectrum Digital Cellular System Dual-Mode Mobile Station—Base Station Compability Standard," TR45.5, (Apr. 21, 1992).

Rick et al., "Noncoherent Parallel Acquisition in CDMA Spread Spectrum Systems," IEEE, pp. 1422 - 1426, (May 1994).

Salmasi et al., "On the System Design Aspects of Code Division Multiple Access (CDMA) Applied to Digital Cellular and Personal Communications Networks," *Vehicular Technology Conference, 1991. 'Gateway to the Future Technology in Motion', 41th IEEE*, pp. 57-62, (May 19-22, 1991).

Sarwate et al., "Crosscorrelation Properties of Pseudorandom and Related Sequences," Proceedings of the IEEE, IEEE, New York, US, vol. 68, No. 5, pp. 593-619, XP002939579 (May 1, 1980).

Schilling, "Broadband-CDMA; Onephone for a Wireless Twenty First Century," ICPWC'94, pp. 1-5, (IEEE 1994).

Schnell, "Hadamard Codewords as Orthogonal Spreading Sequences in Synchronous DS CDMA Systems for Mobile Radio Channels," IEEE Third International Symposium on Spread Spectrum Techniques and Applications, vol. 2, pp. 505 - 509, (Jul. 4-6, 1994).

Scholtz, "The Origins of Spread Spectrum Communications," *IEEE Transactions on Communications*, vol. COM-30, No. 5, pp. 822-854, (May 1982).

Siemens AG, "CDMA/link System Description," ver.3.00 (Mar. 10, 1995).

Simon et al., *Spread Spectrum Communications Handbook*, Revised Edition pp. 262-396, (McGraw Hill New York, 1994).

Simpson et al., "CDMA Power Control, Interleaving, and Coding," *41st IEEE Vehicular Technology Conference*, (St. Louis, MO, May 19-22, 1991) pp. 362-367, (IEEE 1991).

Simpson et al., "Direct Sequence CDMA Power Control, Interleaving and Coding," *IEEE Journal on Selected Areas in Communications*, vol. 11, No. 7, pp. 1085-1095, (Sep. 1993).

Soliman et al., "CDMA Reverse Link Open Loop Power Control," *Globecom '92 IEEE Global Telecommunications Conference* (Orlando, FL, Dec. 6-8, 1992) pp. 69-73, (IEEE 1992).

Tachikawa et al., "Nonlinear Code Sequence for Rapid Acquisition— Ref. 3", Study Report of the Spread Spectrum Communication System Study Group, the Institute of Electrical, Information, Electronics and Communications Engineers of Japan (IEIEC), (Mar. 25, 1987). Translation provided.

Telecommunications Industry Association, TIA/EIA/IS-95-A (Revision of TIA/EIA/IS-95), "TIA/EIA Interim Standard: Mobile Station — Base Station Compatibility Standard for Dual-Mode Wideband Spread Spectrum Cellular System," (May 1995).

Tia/E1A/1S-95, "Mobile Station-Base Station Compatibility Standard for Dual-Mode Wideband Spread Spectrum Cellular System", TIA/EIA Interim Standard, pp. 7-12, 7.14, and 7.15 (Telecommunications Industry Association, Jul. 1993).

TIA/EIA/IS-95-A, "Mobile Station-Base Station Compatibility Standard for Dual-Mode Wideband Spread Spectrum Cellular System", TIA/EIA Interim Standard, (Telecommunications Industry Association, May 1995).

Tiedemann et al., " The Design and Development of a Code Division Multiple Access (CDMA) System for Cellular and Personal Communications," *IEEE International Symposium on Personal, Indoor and Mobile Radio Communications*, (London, Uk, Sep. 23-25, 1991) pp. 131-136, (IEEE 1991).

Van Nielen, "UMTS: A Third Generation Mobile System"*PIMRC '92* (Boston, MA, Oct. 19-21, 1992) pp. 17-21, (1992).

Wu et al, "A Study on Wireless Multi-media CDMA Systems that Maximize Throughput," Technical Report of IEICE, It94-144, SST94-97, pp. 25-30, Japan, Mar. 1995.

Zagami et al., "Providing Universal Location Services Using a Wireless E911 Location Network," *IEEE Communications Magazine*, pp. 66-71, (Apr. 1998).

Ziemer et al., *Digital Communications and Spread Sepctrum Systems*, pp. 492-94 (Collier Macmillan 1985).

Zimmerman et al., "CDMA and ATM-zwei Technologien, ein Zeil, (CDMA and ATM -'Ideal Partners)" *2323 Telecom Report Siemens*, vol. 18, No. 2, pp. 60-63, (1995 Maerz/April, München, DE), from http://www.siemens.de/telcom/artike1/0295/295zimm.htm Translation provided in: *Siemens Telcom Report International* from http://www.siemens.de/telcom/articles/e0395/395zimm.htm Siemens Topritm.

U.S. Appl. No. 60/069,511, date issued Dec. 15, 1997, Butovitsch.

U.S. Appl. No. 60/090,236, date issued Jun. 22, 1998, Butovitsch.

U.S. Appl. No. 60/290,740, date issued May 14, 2001, Wen.

U.S. Appl. No. 60/290,740, date issued May 14, 2001, Terry et al.

Andersson et al, "œPCS Support in IS-54C, • Third Annual International Conference on Universal Personal Communications, pp. 114-118 (Sep. 1994).

Expert Report of Mark Lanning Regarding Invalidity of U.S. Pat. Nos. 6,674,791; 7,117,004; 7,190,966; and 7,286,847, in the Matter of Certain 3G Mobile Handsets and Components, Investigation No. 337-TA-613, Feb. 1, 2008.

Nokia Corporation and Nokia Inc. ™s Response to the Amended Complaint and Amended Notice of Investigation, In the Matter of Certain Wireless Devices with 3G Capabilities and Components Thereof, Investigation No. 337-TA-800, Jan. 27, 2012.

Nokia Corporation and Nokia Inc. ™s Response to the Complaint and Notice of Investigation, in the Matter of Certain Wireless Devices with 3G Capabilities and Components Thereof, Investigation No. 337-TA-800, Sep. 27, 2011.

Response of Respondent Futurewei to Complaint Under Section 337 of the Tariff Act of 1930, as Amended, and Notice of Investigation, In the Matter of Certain Wireless Devices with 3G Capabilities and Components Thereof, Investigation No. 337-TA-800, Sep. 27, 2011.

Response of Respondent Huawei to Amended Complaint Under Section 337 of the Tariff Act of 1930, as Amended, and Amended Notice of Investigation, In the Matter of Certain Wireless Devices with 3G Capabilities and Components Thereof, Investigation No. 337-TA-800, Jan. 27, 2012.

Response of Respondent Huawei to Complaint Under Section 337 of the Tariff Act of 1930, as Amended, and Notice of Investigation,

(56) References Cited

OTHER PUBLICATIONS

In the Matter of Certain Wireless Devices with 3G Capabilities and Components Thereof, Investigation No. 337-TA-800, Sep. 27, 2011. Response of ZTE Corporation and ZTE (USA) to the Amended Complaint of Interdigital Communications, LLC, Interdigital Technology Corp., and IPR Licensing, Inc. under Section 337 of the Tariff Act of 1930, as Amended, and Notice of Investigation, In the Matter of Certain Wireless Devices with 3G Capabilities and Components Thereof, Investigation No. 337-TA-800, Jan. 27, 2012.
Sasaki et al, â€œVoice Activity Detection and Transmission Error Control for Digital Cordless Telephone System, â€• IEICE Transactions on Communications, vol. E77-B, No. 7, pp. 948-954 (Jul. 1994).
Southcott et al., â€œVoice Control of the Pan-European Digital Mobile Radio System,â€• Proceedings of the Global Telecommunications Conference and Exhibition, IEEE Global Telecommunications Conference and Exhibition, Communications Technology for the 1990s and Beyond, vol. 2, pp. 1070-1074 (Nov. 1989).
Supplemental Response of Respondent Futurewei to Complaint Under Section 337 of the Tariff Act of 1930, as Amended, and Notice of Investigation, In the Matter of Certain Wireless Devices with 3G Capabilities and Components Thereof, Investigation No. 337-TA-800, Jan. 12, 2012.
Baier et al., "Multi-Rate DS-CDMA radio interface for third-generation cellular," Mobile and Personal COmmunication, pp. 255-260, Seventh IEE European Conference, Dec. 15, 1993.
Errata to Response of Respondents Samsung Electronics Co., Ltd., Samsung Electronics America, Inc., and Samsung Telecommunications America, LLC to the Complaint and Notice of Investigation, In the Matter of Certain Wireless Devices with 3G and/or 4G Capabilities and Components Thereof, Investigation No. 337-TA-868, Feb. 28, 2013.
Errata to Response of Huawei Respondents to Complaint Under Section 337 of the Tariff Act of 1930, As Amended, and Notice of Investigation, In the Matter of Certain Wireless Devices with 3G and/or 4G Capabilities and Components Thereof, Investigation No. 337-TA-868, Mar. 1, 2013.
Huawei Respondents Response to Complaint Under Section 337 of the Tariff Act of 1930, As Amended, and Notice of Investigation, In the Matter of Certain Wireless Devices with 3G and/or 4G Capabilities and Components Thereof, Investigation No. 337-TA-868, Feb. 21, 2013.
Nokia Corporation and Nokia Inc.'s Response to the Complaint of InterDigital Communications, Inc., InterDigital Technology Corporation, IPR Licensing, Inc. and Interdigital Holdings, Inc. Under Section 337 of the Tariff Act of 1930, as Amended, and Notice of Investigation, In the Matter of Certain Wireless Devices with 3G and/or 4G Capabilities and Components Thereof, Investigation No. 337-TA-868, Mar. 1, 2013.
Response of Respondents Samsung Electronics Co., Ltd., Samsung Electronics America, Inc., and Samsung Telecommunications America, LLC to the Complaint and Notice of Investigation, In the Matter of Certain Wireless Devices with 3G and/or 4G Capabilities and Components Thereof, Investigation No. 337-TA-868, Feb. 21, 2013.
Abeta, S., et al., "Fast Coding and Processing Gain Control for DS/CDMA Systems," Proceedings of the 1996 IEICE General Conference, B-1 Antennas, propagation, (Mar. 1995). (English Title Only).
Abeta, et al., "Performance Analysis of Coding Rate and Processing Gain Control with Soft Power Control for Cellular DS/CDMA Systems," The Institute of Electronics, Information and Communication Engineers, Technical Report, vol. 95, No. 62, (May 1995). (English Abstract Only).
Adachi, F., et al., "Coherent Multicode DS-CDMA Mobile Radio Access for Next Generation System," (NTT Mobile Communications), The Institute of Electronics, Information and Communication Engineers, Technical Report, vol. 95, No. 310, Oct. 1995. (English Abstract Only).

Alavi, "Power Control and Interference Management in a Spread-Spectrum Cellular Mobile Radio System," (unpublished Ph.D. thesis—Michigan State University Department of Electrical Engineering and Systems Science) (on file with the Michigan State University Libraries), (1984).
Andermo, PG, et al., "CODIT and Third Generation Systems," 1995 4.sup.th IEEE International Conference on Universal Personal Communications Record, pp. 843-847 (Nov. 6-10, 1995).
Baier, "An Open Multi-Rate Radio Interface based on DSCDMA," RACE Mobile Telecommunications Workshop at 123 (Jun. 16-18, 1993).
Cameron, R. et al., "An Analysis of CDMA with Imperfect Power Control," IEEE 42nd Vehicular Technology Conference, vol. 2, pp. 977-980 (May 1993).
Cideciyan, R., et al., "Performance of the CODIT Radio Interface," IBM Research Division, Zurich Research Laboratory, 1995.
Dohi, T., et al., "Effects of SINR based transmit power control in the presence of non-uniform traffic distribution," (NTT Mobile Communications), Proceedings of the 1996 IEICE General Conference, B-1 Antennas, propagation, (Mar. 1995). (English Title Only).
Doi, N., et al., DS/CDMA prototype system transmitting low bit-rate voice and high bit-rate ISDN signals (IEEE, 1994).
Esmailzedah, R, "A Comparison on the Performance of the FDD and TDD Modes of B-CDMA Communications" (IEEE, 1995), pp. 339-343 (Apr. 1995).
Higashi et al., "Performance of Coherent Detection and RAKE for DSCDMA Uplink Channels," IEEE at 436 (Jan. 1995).
Jalali et al., "Effects of Diversity, Power Control, and Bandwidth on the Capacity of Microcellular CDMA Systems," , IEEE, pp. 952-961 (1994).
Jalali, A., "On the Bandwidth Efficiency of CDMA System," IEEE, pp. 515-519 (1994).
Krzymien, "Performance of a Reference Symbol Assisted Multi-stage Successive Interference Cancelling Receiver in a Multi-Cell CDMA Wireless System," IEEE at 152 (May 1995).
Lee, C. et al., "Closed-loop power control in CDMA systems," Steele, R., IEEE Proc.-Commun., vol. 143, No. 4, (Aug. 1996).
Ohkawa, et al., Improvement of Data Error Rate for Orthogonal Multi-Carrier FH-CMDA Schemes Used Power Control, The Institute of Electronics, Information and Communication Engineers, Technical Report, vol. 93, No. 539, (Mar. 1994). (English Abstract Only).
Ojanpera, et al., "Design of a 3rd Generation Multirate CDMA System with Multiuser Detection," MUD-CDMA, IEEE, pp. 335-338, (1996).
Okawa, et al., "Performance of multicode transmission with transmit power control on DS-CDMA," Proceedings of the 1996 IEICE General Conference, B-1 Antennas, propagation, (Mar. 1996). (English Title Only).
Okumura, et al., "A transmission experiment on coherent multicode DSCDMA mobile radio access," (NTT Mobile Communications), The Institute of Electronics, Information and Communication Engineers, Technical Report, vol. 95, No. 310, (Oct. 1995). (English Abstract Only).
Olle, G., et al., "CODIT System Management Packet Services Functionality," Ericsson Radio Systems AB.
Otsuka, et al., "Digital Cellular Base Station System," NEC Technical Report vol. 47 No. 9, Sep. 1994. (English Abstract Only).
RACE Mobile Telecommunications Summit, agenda and schedule, Cascais, Portugal, Nov. 22-24, 1995 (1995).
RACE Mobile Telecommunications Workshop, Amsterdam, The Netherlands, May 17-19, 1994 (1994).
Saluvere et al., "Direct Sequence Spread Spectrum Digital Radio DSP Prototyping Using Xilinx FPGAs," Proceedings of the 4th International Workshop (Sep. 1994). (English Abstract Only).
Sawahashi, M., et al., "Pilot symbol-assisted coherent multistage interference canceller using recursive channel estimation for OSCOMA mobile radio," Electronics Letters vol. 32 No. 4 at 301 (Feb. 15, 1996).
Stefansson, T., et al., "Real-time Testbed for Assessing a CDMA-based System," IEEE Personal Communications, Oct., 1995, pp. 75-80 (Oct. 1995).

(56) References Cited

OTHER PUBLICATIONS

Swales, et al., "A Comparison of CDMA Techniques for Third Generation Mobile Radio Systems" (IEEE, 1993) (1993).
Urie, et al., "An Advanced TDMA Mobile Access System for UMTS," IEEE 1995, pp. 38-47, (Feb. 1995).
Viterbi, et al., "Performance of Power-Controlled Wideband Terrestrial Digital Communication,", IEEE Transactions on Communications, vol. 41, No. 4, (Apr. 1993).
Walter, P, "CODIT Macro Diversity and Handover Performance in an Outdoor Environment," Telia Research AB.
Wu, J., et al., "A Study of Multi-Media CDMA System Using Channel Measurement Information," the Institute of Electronics, Information and Communication Engineers, Technical Report, vol. 94, No. 281, (Oct. 1994). (English Abstract Only).
Public Version of Initial Determination, In the Matter of Certain Wireless Devices with 3G Capabilities and Components Thereof, Investigation No. 337-TA-800, Jun. 28, 2013.
Public Version of Commission Opinion, In the Matter of Certain Wireless Devices with 3G Capabilities and Components Thereof, Investigation No. 337-TA-800, Feb. 19, 2014.
Andermo, PG, "Overview of CODIT Project.".
Answer, Affirmative Defenses, and Counterclaims to Amended Complaint, In the United States District Court of Delaware, C.A. No. 13-011-RGA, Apr. 24, 2013.
Answers and Affirmative Defenses and Counterclaims of ZTE (USA) Inc., In the United States District Court for the District of Delaware, C.A. No. 13-009-RGA, Jan. 31, 2013.
Answer and Counterclaims, In the United States District Court for the District of Delaware, C.A. No. 13-010 (RGA), Redacted Pbulic Version, Mar. 7, 2013.
Answer and Counterclaims to Amended Complaint, In the United States District Court for the District of Delaware, C.A. No. 13-010 (RGA), Redacted Public Version, Apr. 1, 2013.
Association of Radio Industries and Businesses (ARIB), Specifications for Air-Interface for 3G Mobile System, Revision 1.0, Jan. 14, 1999.
Association of Radio Industries and Businesses (ARIB), Integrated Dispatch Radio System ARIB Standard, RCR STD-32A, Digital MCA System, Mar. 17,1993.
ARIB RCR STD-39, Digital Land Mobile Telecommunication System for Public Utilities, Feb. 28, 1994 Feb. 28, 1994.
Ariyavisitakul et al., "Signal and Interference Statistics of a CDMA System with Feedback Power Control,". IEEE Transactions on Communications, vol. 41, No. 11, p.1626-1634 (IEEE, Nov. 1993)
Bdira, "Link Layer Analysis of Integrated Hybrid CDMA Networks for Mobile and Satellite Communication Channels," (Jul. 1995).
Beach et al., "An Evaluation of Direct Sequence CDMA for Future Mobile Communication Networks," 1991 41st Vehicular Technology Conference, p. 63-70 (IEEE, May 19-22, 1991).
Borgonovo et al., "Capture-Division Packet Access for Wireless Personal Communications," IEEE Transactions on Vehicular Technology, vol. 46, No. 3, p.609-622 (IEEE, Aug. 1997).
Chang et al., "Adaptive Fuzzy Power Control for CDMA Mobile Radio Systems," IEEE Transactions on Vehicular Technology, vol. 45, NO. 2, p. 225-236 (IEEE, May 1996).
Chang et al., "Down-link Power in DS/CDMA Cellular Mobile Radio Network," 1994 Third Annual International Conference on Universal Personal Communications, P. 89-93 (IEEE, Sep. 27- Oct. 1, 1994).
Chau et al., "Baseband Processing for the CODIT Testbed," Race Mobile Telecommunications Workshop, p. 244 (May 1994).
Chen et al., "An Adaptive Multiuser Receiver for CDMA Systems," IEEE Journal on Selected Areas in Communications, vol. 12, No. 5, p. 808-816 (IEEE, Jun. 1994).
Dent et al., "CDMA-IC: A Novel Code Division Multiple Access Scheme Based on Interference Cancellation,". 1992 Thired IEEE International Sumposium on Personal, Indoor and Mobile Radio Communications, p. 98-102 (IEEE, Oct. 19-21, 1992)

Duel-Hallen et al., "Multiuser Detection for CDMA Systems," IEEE Personal Communications, vol. 2, No. 2, p. 46-58 (IEEE, Apr. 1995)
Evans, "Traffic Modeling of Cellular Mobile Communications Systems Operating with Code Division Multiple Access," (Jul. 1995).
Everitt, "Traffic Engineering of the Radio Interface for Cellular Mobile Networks," Proceedings of the IEEE, vol. 82, No. 9, p. 1371-1382 (IEEE Sep. 1994).
Falconer et al., "Time Division Multiple Access Methods for Wireless Personal Communications," IEEE Communications Magazine, p. 50-57 (IEEE, Jan. 1995).
First Amended Answer and Counterclaims to Amended Complaint, In the United States District Court for the District of Delaware, C.A. No. 13-010 (RGA), Redacted Public Version, Aug. 6, 2013.
Fujii et al., "Received Signal Level Characteristics with Adaptive Transmitter Power Control in Mobile Communications," (NTT) The Transaction of the Institute of Electronics, Information and Communication Engineers, vol. J72-B-II, No. 9, pp. 434-441 (Sep. 1989)
Fujii, "Reduction of Mobile Radio Co-Channel Interference by Adaptive Transmitter Power Control in Correlated Showing Condition," (NTT), The Transaction of the Institute of Electronics, Information and COmmunication Engineers, vol. J75-B-II, No. 12 (Dec. 1992).
Gass et al., "Spectral Efficiency of a Power-Controlled CDMA Mobile Personal Communication System," IEEE Journal on Seledcted Areas in Communications, vol. 14, No. 3, p. 559-569 (IEEE, Apr. 1996).
Gilhousen et al., "On the Capacity of a Cellular CDMA System," IEEE Transactions on Vehicular Technology, vol. 40, No. 2, p. 303-312 (IEEE, May 1991).
Huang et al., "Call Admission in Power Controlled CDMA Systems," 1996 IEEE 46th Vehicular Technology Conference, vol. 3, p. 1665-69 (IEEE, Apr. 28-May 1, 1996).
Jalali et al, "Power Control and Diversity for the Downlink of CDMA Systems," 1993 2nd International Conference on Universal Personal Commnications, vol. 2, p. 980-984 (IEEE, Oct. 12-15, 1993).
Jansen et al., "Capacity, Throughput, and Delay Analysis of a Cellular DS CDMA System with Imperfect Power Control and Imperfect Sectorization," IEEE Transactions on Vehicular Technology, vol. 44, No. 1, p. 67-75 (IEEE, Feb. 1995).
Kahn, "The Organization of Computer Resources in a Packet Radio Network," IEEE Transactions on Communications, vol. 25, p. 169-178 (Presented at National Computer Conference, Anaheim, CA, 1975) (Jan. 1977).
Katz, "Adaptation and Mobility in Wireless Information Systems," IEEE Personal Communications, vol. 1, No. 1, p. 6-17 (IEEE, Q1 1994)
Kerr et al., "The CDMA Digital Cellular System an ASIC Overview," 1992 Third IEEE International Symposium on Personal, Indoor and Mobile Radio Communications, p. 36-41 (IEEE, Oct. 19-21, 1992).
Ketchum, "Reed-Solomon and Slow Frequency Hopping for Narrowband Digital Cellular Systems," 1992 IEEE 42nd Vehicular Technology Conference, vol. 1, pp. 225-228 (IEEE, 1992).
Labedz et al., "Predicting Real-World Performance for Key Parameters in a CDMA Cellular System," 1996 IEEE 46th Vehicular Technology Conference, vol. 3, p. 1472-1476 (IEEE, Apr. 28-May 1, 1996).
Larsson et al., "Power Control in the CODIT Testbed," Race Mobile Telecommunications Workshop, p. 147 (May 1994)
Lavery et al., "Analysis of the Uplink Teletraffic Behaviour in CDMA Cellular Systems," 1994 IEEE 44th Vehicular Technology Conference, vol. 2, p. 868-872 (IEEE, Jun. 8-10, 1994).
Lee et al., "Downlink Power Control Algorithms for Cellular Radio Systems," IEEE Transactions on Vehicular Technology, vol. 44, No. 1, p. 89-94 (IEEE, Feb. 1995)
Lucas, "Synchronisation Procedure in Up & Down-Link in the CODIT Testbed," RACE Mobile Workshop, Amsterdam (May 1994).

(56) References Cited

OTHER PUBLICATIONS

Morris, "UMTS and the RACE II CODIT Project," IEE Colloquium on Mobile Communications Towards the Year 2000, pp.8/1-8/4 (IEEE, Oct. 1994).
Nettleton et al., "Power Control for a Spread Spectrum Cellular Mobile Radio System," 1983 33rd IEEE Vehicular Technology Conference, p. 242-246 (IEEE, May 25-27, 1983).
Ohno et al., "Wideband Coherent DS-CDMA," p. 779-783 (IEEE, Jul. 1995).
Okuno et al., "Automatic Transmitting Power Control for Outage-free Digital Microwave Radio," NTT Review, vol. 3, No. 1, Jan. 1991.
Ozluturk et al., "Effect of Limiting the Downlink Power in CDMA Systems with or without Forward Power Control," IEEE Military Communications Conference, vol. 3, (IEEE, Nov. 8, 1995).
Padgett et al., "Overview of Wireless Personal Communications," IEEE Communications Magazine, vol. 33, No. 1, p. 28-41 (IEEE, Jan. 1996).
Patel et al., "Analysis of a Simple Successive Interference Cancellation Scheme in a DS/CDMA System," IEEE Jounral on Selected Areas in Communications, vol. 12, No. 5, p.796-807 (IEEE, Jun. 1994).
Patent Abstracts of Japan, vol. 015, No. 003 (E-1019), Jan. 7, 1991 & JP, 02 256331 A (Sharp Corp.), Oct. 17, 1990
Petition for Review, in the United States Court of Appeals for the Federal Circuit, Case: 14/1176, Dec. 20, 2013.
Pickholtz et al, "Theory of Spread-Spectrum Communications—A Tutorial," IEEE Transactions on Communications, vol. 30, No. 5, pp. 855-884 (IEEE, May 1992).
Pollini, "Trends in Handover Design," IEEE Communications Magazine, p. 82-90 (IEEE, Mar. 1996).
Proposed EIA/TIA Interim Standard: Wideband Spread Spectrum Digital Cellular System Dual-Mode Mobile Station—Base Station Compatibility Standard, Apr. 21, 1992.
Public Version of Initial Determination on Violation of Section 337 and Recommended Determination on Remedy and Bond, In the Matter of Certain Wireless Devices with 3G and/or 4G Capabilities and Components Thereof, Investigation No. 337-TA-868, Jun. 13, 2014.
Pursley, "Performance Evaluation for Phase-Coded Spread-Spectrum Multiple-Access Communication—Part 1: System Analysis," IEEE Transactions on COmmunications, vol. 25, No. 8, pp. 795-799 (Aug. 1977).
Rosberg et al., "Power Control in Wireless Networks with Random Interferes," (Sep. 1995).
Salehi et al., Coherent Ultrashort Light Pulse Code-Division Multiple Access Communication Systems, Journal of Lightware Technology, vol. 8, No. 3, p. 478-491 (IEEE, Mar. 1990).
Simon, "Spread Spectrum Communications Handbook," Chapter 5—Pseudonoise Generations, 1994.
Su et al., "Reverse-Link Power Control Strategies for CDMA Cellular Network," 1995 6th IEEE International Symposium on Personal, Indoor, and Mobile Radio Communications, vol. 2, pp. 461-465 (IEEE, Sep. 27-29, 1995).
Swales et al., "The U.K. Link Personal Communications Programme: Downlink Design for a DS-CDMA Field Trial System," (IEEE, 1995).
Swales et al., "The U.K. Link Personal Communications Programme: Downlink Design for a DS-CDMA Field Trial System," Institution of Electrical Engineers (IEE, 1994).
Taaghol et al., "Power Control in CDMA Based PCN," IEE Colloquium on Spread Spectrum Techniques for Radio Communication Systems, pp. 5/1-5/6 (IEE, Apr. 15, 1994).
Tajima et al., "Dynamic Channel Assignment Technology for Cellular Mobile Communication Systems," Fujitsu, vol. 45, No. 2, Mar. 1994.
Tokuda et al., "Wideband CDMA System for Personal Mobile Communication," OKI Technical Review, Aug. 1995.

Tonguz et al., "Cellular CDMA Networks Impaired by Rayleigh Fading: System Performance with Power Control," IEEE Transactions on Vehicular Technology, vol. 43, No. 3, p.515-527 (IEEE, Aug. 1994).
Vasavada, "Performance Evaluation of a Frequency Modulated Spread-Spectrum System," Virginia Polytechnic Institute, p. (May 1996).
Viterbi et al., "Implications of Mobile Cellular CDMA," IEEE Communications Magazine, vol. 30, No. 12, p. 38-41 (IEEE, Dec. 1992).
Viterbi et al., "Performance of a Nonparametric Power Allocation Algorithm for Wideband Terrestrial Digital COmmunication," 1994 Proceedings of the 33rd IEEE Conference on Decision and Control, vol. 3, p. 2825-2826 (IEEE, Dec. 14-16, 1994).
Viterbi et al., "Soft Handoff Extends CDMA Cell Coverage and Increases Reverse Link Capacity," IEEE Journal on Selected Areas in Communications, vol. 12, No. 8, p. 1281-1288 (IEEE, Oct. 1994).
Vojcic et al., "Power Control Versus Capacity of a CDMA System Operating Over a Low Earth Orbiting Satelite Link," 1993 IEEE Global Telecommunications Conference, vol. 4, p. 40-44 (IEEE, Nov. 29-Dec. 2, 1993).
Wang et al., "Interference Avoidance and Power Control Strategies for Coded Frequency Hopped Cellular Systems," 1995 IEEE International Conference on Communications, vol. 3, p. 1737-1741 (IEEE, Jun. 18-22, 1995).
Wu et al., "A Wireless Multimedia CDMA System Based on Transmission Power Control," IEEE Journal on Selected Areas in Communications, Vol. 14, No. 4, p. 683-691 (IEEE, May 1996).
Yun et al., "Variable Quality of Service in CDMA Systems by Statistical Power Control," p. 1-7 (1995).
Zander, "Transmitter Power Control for Co-channel Interference Management in Cellular Radio Systems," Proc. 4th WINLAB Workshop, p. 1-15 (1993).
Zorzi et al., "Packet Access for Cellular Systems: The Capacity of S- Aloha and CDPA with Slow SHadowing," Workshop on Multi-access, Mobility and Teletraffic for Personal Communication, Paris, France, (May 20-22, 1996).
ZTE (USA) Inc.'S Amended Answer, Affirmative Defenses, and Counterclaims to Plaintiffs' Amended Complaint, In the United States Court for the District of Delaware, C.A. No. 13-009-RGA, Redacted Public Version, Aug. 7, 2013.
ZTE Corp.'s Amended Answer, Affirmative Defenses, and Counterclaims to Plaintiffs' Amended Complaint, C.A. No. 13-009-RGA, Redacted Public Version, Sep. 3, 2013.
ZTE (USA) Inc.'S Answer, Affirmative Defenses, and Counterclaims to Plaintiffs' Amended Complaint, C.A. No. 13-009-RGA, Mar. 22, 2013.
Amended Answer to Amended Complaint, In the United States District Court for the District of Delaware, C.A. No. 13-08-RGA, Apr. 30, 2013.
Answer to Amended Complaint, In the United States District Court for the District of Delaware, C.A. No. 13-08-RGA, Mar. 22, 2013.
Answer and Counterclaims, In the United States District Court for the District of Delaware, C.A. No. 13-008-RGA, Jan. 24, 2013.
Petition for Review, United States Court of Appeals for the Federal Circuit, Case: 15-1051, Oct. 10, 2014.
Public Version of Commission Opinion, In the Matter of Certain Wireless Devices with 3G and/or 4G Capabilities and Components Thereof, Investigation No. 337-TA-868, Aug. 28, 2014.
RACE Mobile Telecommunications Workshop, pp. 1-502, Metz, Jun. 16-18, 1993.
Magnus et. al, "Quality Based Power Control in the CODIT UMTS Concept".
Petition for Review, In the United States Court of Appeals for the Federal Circuit, Case: 14-1419, (Apr. 14, 2014).
Interdigital Communications, Inc. et al. v. United States International Trade Commission et al., U.S. Court of Appeals for the Federal Circuit, Appeals from the United States International Trade Commission in Investigation No. 337-TA-800, pp. 1-19 (Feb. 18, 2015).

(56) References Cited

OTHER PUBLICATIONS

The Patent Reexamination Board of the State Intellectual Property Office of the People's Republic of China, "Examination Decision on Request for Invalidation," Chinese Patent No. ZL96195906.1, Jun. 19, 2013.
The Patent Reexamination Board of the State Intellectual Property Office of the People's Republic of China, "Decision of Request for Invalidation," Chinese Patent No. ZL02143971.0, Dec. 24, 2012.
Response of ZTE Corporation and ZTE (USA) to the Complaint of InterDigital Communications, LLC Under Section 337 of the Tariff Act of 1930, As Amended, and Notice of Investigation, In the Matter of Certain Wireless Devices with 3G and/or 4G Capabilities and Components Thereof, Investigation No. 337-TA-868, Feb. 22, 2013.
The Patent Reexamination Board of the State Intellectual Property Office of the People's Republic of China, "Decision on Request for Invalidation," Chinese Patent No. ZL02143971.0, Dec. 25, 2015.
U.S. Appl. No. 60/177,093, date issued Jan. 20, 200, Tong et al.
Baier, "An Open Multi-Rate Radio Interface based on DSCDMA—The Radio Interface Concept of CODIT," RACE Mobile Telecommunications Workshop (Jun. 16-18, 1993).
Dissertation Abstracts International, "B, The Sciences and Engineering," Ann Arbor, Michigan, University Microfilms, vol. 55, No. 11, p. 5005-B (May 1995).
Dixon, "Spread Spectrum Systems," John Wiley & Sons Inc., 2nd edition, pgs. 1, 60-63, 68-73, (1984).
Dixon, "Spread Spectrum Systems With Commercial Applications," Third Edition, pp. 352, 404-405 (John Wiley & Sons, Inc. 1994).
Gardiner, "Second generation cordless (CT-2) telephony in the UK: telepoint services and the common air-interface," Electronics & Communication Engineering Journal, (Apr. 1990).

Higashi et al., "Performance of Coherent Detection and RAKE for DS-CDMA Uplink Channels," IEEE (Jan. 1995).
Kurpis, et al., "The New IEEE Standard Dictionary of Electrical and Electronics Terms [Including Abstracts of All current IEEE Standards]," Fifth Edition, p. 224, (1993).
Larsson, "Power Control in the CODIT Testbed, " RACE Mobile Telecommunications Workshop (May 1994).
Lathi, "Modem Digital and Analog Communication Systems," Holt, Rinehart and Winston, pp. 63-65, 179-182, (1983).
Lee, "Mobile Communications Design Fundamentals," 2nd Edition, John Wiley & Sons, Inc., pp. 300-301 (1993).
Okazaki et al., "Transmitter Power Control for DS-CDMA System," the Institute of Electronics, Information and communication Engineers, Technical Report, vol. 94, No. 547, (May 1994).
Oppenheim et al, "Discrete-Time Signal Processing," Prentice-Hall Signal Processing Series, Sec. A.3, pp. 841-842 (1989).
Papoulis, "Probability, Random Variables and Stochastic Processes," 3rd Edition, McGraw Hill (1991).
Proakis, "Digital Communications," 3rd Edition, McGraw Hill, pp. 65-67 and 724-729 (1995).
Proakis, "Digital Communications," 1st Edition, pp. 45-48 and 566-570, (1983).
Smith, "Digital Transmission Systems," Van Nostrand Reinhold Company, New York, pp. 89-90 (1985).
TIA/EIA/IS-95, "Mobile Station-Base Station Compatibility Standard for Dual-Mode Wideband Spread Spectrum cellular System," TIA/EIA Interim Standard, Telecommunications Industry Association, (Jul. 1993).
Viterbi et al., "Erlang Capacity of a Power Controlled CDMA System," IEEE Journal on Selected Areas in Communications, vol. 11, No. 6, pp. 892-900, (Aug. 1993).
Proposed EIA/TIA Interim Standard: Wideband Spread Spectrum Digital Cellular System Dual-Mode Mobile Station—Base Station, Compatibility Standard (SCS), (Aug. 14, 1992).

AUTOMATIC POWER CONTROL SYSTEM FOR A CODE DIVISION MULTIPLE ACCESS (CDMA) COMMUNICATIONS SYSTEM

CROSS-REFERENCE TO RELATED APPLICATIONS

This application is a continuation of U.S. patent application Ser. No. 10/084,007, filed Feb. 27, 2002, which is a continuation of U.S. patent application Ser. No. 09/833,285, filed Apr. 12, 2001, which issued as U.S. Pat. No. 6,873,645 on Mar. 29, 2005, which is a continuation of U.S. patent application Ser. No. 09/406,162, filed Sep. 27, 1999, now abandoned, which is a continuation of U.S. patent application Ser. No. 08/669,770, filed Jun. 27, 1996, which issued as U.S. Pat. No. 5,991,329 on Nov. 23, 1999, which claims the benefit of Provisional Patent Application Ser. No. 60/000,775, filed Jun. 30, 1995, which applications are incorporated by reference as if fully set forth.

BACKGROUND OF THE INVENTION

Providing quality telecommunication services to user groups which are classified as remote such as rural telephone systems and telephone systems in developing countries, has proved to be a challenge over recent years. These needs have been partially satisfied by wireless radio services, such as fixed or mobile frequency division multiplex (FDM), frequency division multiple access (FDMA), time division multiplex (TDM), time division multiple access (TDMA) systems, combination frequency and time division systems (FD/TDMA), and other land mobile radio systems. Usually, these remote services are faced with more potential users than can be supported simultaneously by their frequency or spectral bandwidth capacity.

Recognizing these limitations, recent advances in wireless communications have used spread spectrum modulation techniques to provide simultaneous communication by multiple users through a single communications channel. Spread spectrum modulation refers to modulating a information signal with a spreading code signal: the spreading code signal being generated by a code generator where the period Tc of the spreading code is substantially less than the period of the information data bit or symbol signal. The code may modulate the carrier frequency upon which the information has been sent, called frequency-hopped spreading, or may directly modulate the signal by multiplying the spreading code with the information data signal, called direct-sequence spreading (DS). Spread-spectrum modulation produces a signal having a bandwidth that is substantially greater than that required to transmit the information signal. Synchronous reception and despreading of the signal at the receiver demodulator recovers the original information. The synchronous demodulator uses a reference signal to synchronize the despreading circuits to the input spread-spectrum modulated signal to recover the carrier and information signals. The reference signal can be a spreading code which is not modulated by an information signal. Such use of a synchronous spread-spectrum modulation and demodulation for wireless communication is described in U.S. Pat. No. 5,228,056 entitled SYNCHRONOUS SPREAD-SPECTRUM COMMUNICATIONS SYSTEM AND METHOD by Donald L. Schilling, which is incorporated herein by reference.

Spread-spectrum modulation in wireless networks offers many advantages because multiple users may use the same frequency band with minimal interference to each user's receiver. In addition, spread spectrum modulation reduces effects from other sources of interference. Also, synchronous spread-spectrum modulation and demodulation techniques may be expanded by providing multiple message channels for a user, each spread with a different spreading code, while still transmitting only a single reference signal to the user. Such use of multiple message In channels modulated by a family of spreading codes synchronized to a pilot spreading code for wireless communication is described in U.S. Pat. No. 5,166,951 entitled HIGH CAPACITY SPREAD-SPECTRUM CHANNEL by Donald L. Schilling, which is incorporated herein by reference.

Another problem associated with multiple access, spread-spectrum communication systems is the need to reduce the total transmitted power of users in the system, since users may have limited available power. An associated problem requiring power control in spread-spectrum systems is related to the inherent characteristic of spread-spectrum systems that one user's spread-spectrum signal is received by another user as noise with a certain power level. Consequently, users transmitting with high levels of signal power may interfere with other users' reception. Also, if a user moves relative to another user's geographic location, signal fading and distortion require that the users adjust their transmit power level to maintain a particular signal quality, and to maintain the power that the base station receives from all users. Finally, because it is possible for the spread-spectrum system to have more remote users than can be supported simultaneously, the power control system should also employ a capacity management method which rejects additional users when the maximum system power level is reached.

Prior spread-spectrum systems have employed a base station that measures a received signal and sends an adaptive power control (APC) signal to the remote users. Remote users include a transmitter with an automatic gain control (AGC) circuit which responds to the APC signal. In such systems the base station monitors to the overall system power or the power received from each user, and sets the APC signal accordingly. Such a spread-spectrum power control system and method is described in U.S. Pat. No. 5,299,226 entitled ADAPTIVE POWER CONTROL FOR A SPREAD SPECTRUM COMMUNICATION SYSTEM AND METHOD, and U.S. Pat. No. 5,093,840 entitled ADAPTIVE POWER CONTROL FOR A SPREAD SPECTRUM TRANSMITTER, both by Donald L. Schilling and incorporated herein by reference. This open loop system performance may be improved by including a measurement of the signal power received by the remote user from the base station, and transmitting an APC signal back to the base station to effectuate a closed loop power control method. Such closed loop power control is described, for 2) example, in U.S. Pat. No. 5,107,225 entitled HIGH DYNAMIC RANGE CLOSED LOOP AUTOMATIC GAIN CONTROL CIRCUIT to Charles E. Wheatley, III et al. and incorporated herein by reference.

These power control systems, however, exhibit several disadvantages. First, the base station must perform complex power control algorithms, increasing the amount of processing in the base station. Second, the system actually experiences several types of power variation: variation in the noise power caused by changing numbers of users and variations in the received signal power of a particular bearer channel. These variations occur with different frequency, so simple power control algorithms can be optimized only to one of the two types of variation. Finally, these power algorithms tend to drive the overall system power to a relatively high level. Consequently, there is a need for a spread-spectrum power control method that rapidly responds to changes in bearer channel power levels, while simultaneously making adjustments to all users' transmit power in response to changes in the number of users. Also, there is a need for an improved spread-spectrum communication system employing a closed loop power control system which minimizes the system's overall power requirements while maintaining a sufficient BER at the individual remote receivers. In addition, such a system should control the initial transmit power level of a remote user and manage total system capacity.

SUMMARY OF THE INVENTION

A receiver receives signals and noise over a frequency spectrum of a desired received signal. The desired received signal is spread using code division multiple access. The received signals and noise are demodulated to produce a demodulated signal. The demodulated signal is despread using a code uncorrelated with a code associated with the desired received signal. A power level of the despread demodulated signal is measured as an estimate of the noise level of the frequency spectrum.

BRIEF DESCRIPTION OF THE DRAWING(S)

DETAILED DESCRIPTION OF THE PREFERRED EMBODIMENT(S)

The system of the present invention provides local-loop telephone service using radio link between one or more base stations and multiple remote subscriber units. In the exemplary embodiment, one radio link is described for a base station communicating with a fixed subscriber unit (FSU), but the system is equally applicable to systems including multiple base stations with radio links to both FSUs and Mobile Subscriber Units (MSUs). Consequently, the remote subscriber units are referred to herein as Subscriber Units (SUs).

Figure 1:
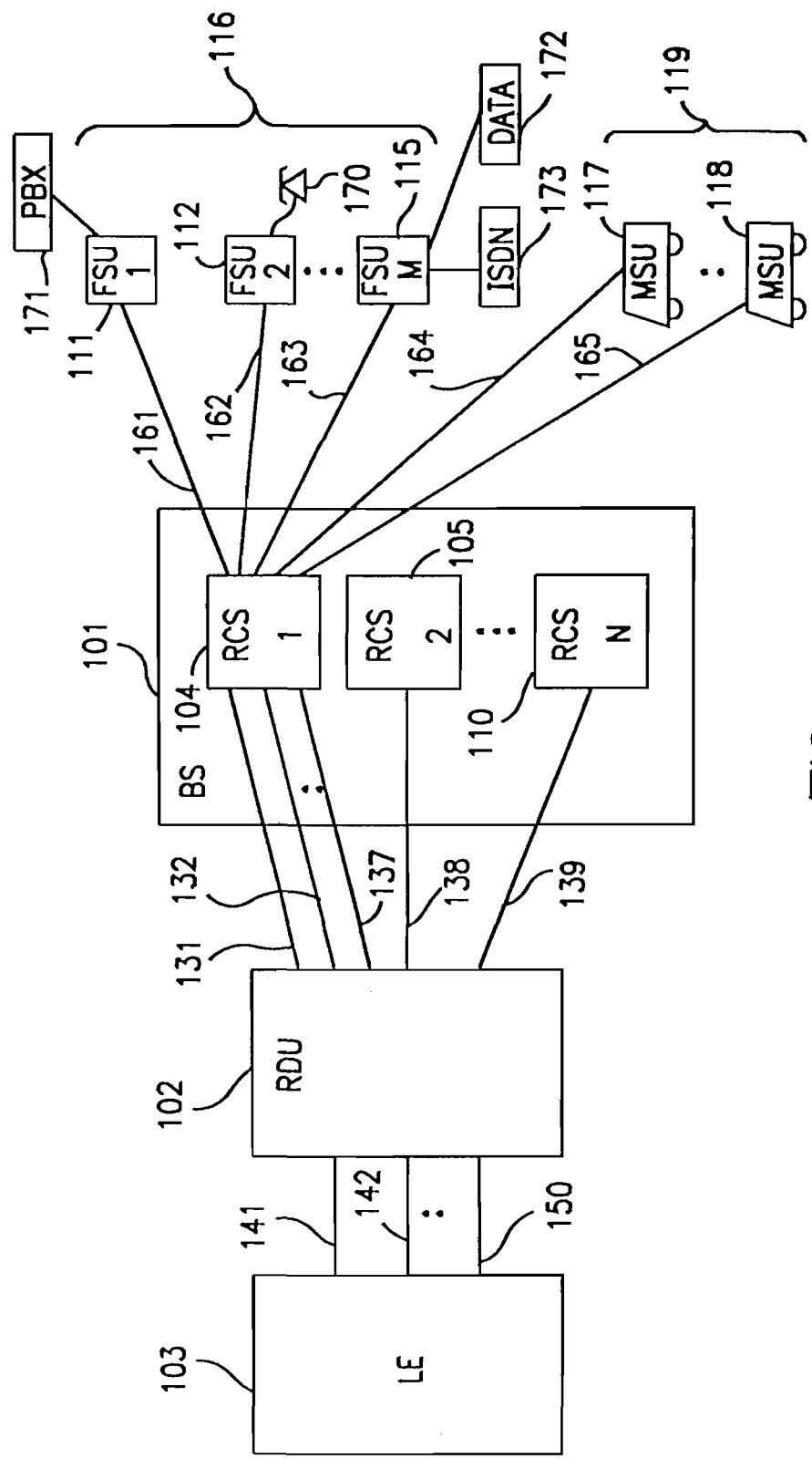
FIG. 1 is a block diagram of a code division multiple access communication system according to the present invention.

Referring to FIG. 1, Base Station (BS) 101 provides call connection to a local exchange (LE) 103 or any other telephone network switching interface, and includes a Radio Carrier Station (RCS) 104. One or more RCSs 104, 105, 110 connect to a Radio Distribution Unit (RDU) 102 through links 131, 132, 137, 138, 139, and RDU 102 interfaces with LE 103 by transmitting and receiving call set-up, control, and information signals through telco links 141, 142, 150. SUs 116, 119 communicate with the RCS 104 through RF links 161, 162, 163, 164, 165. Alternatively, another embodiment of the invention includes several SUs and a "master" SU with functionality similar to the RCS. Such an embodiment may or may not have connection to a local telephone network.

Although the described embodiment uses different spread-spectrum bandwidths centered around a carrier for the transmit and receive spread-spectrum channels, the present method is readily extended to systems using multiple spread-spectrum bandwidths for the transmit channels and multiple spread-spectrum bandwidths for the receive channels. Alternatively, because spread-spectrum communication systems have the inherent feature that one user's transmission appears as noise to another user's despreading receiver, an embodiment can employ the same spread-spectrum channel for both the transmit and receive path channels. In other words, Uplink and Downlink transmissions can occupy the same frequency band. An embodiment of the invention may also employ multiple spread spectrum channels which need not be adjacent in frequency. In this embodiment, any channel may be used for Uplink, Downlink or Uplink and Downlink transmission.

In the exemplary embodiment, the spread binary symbol information is transmitted over the radio links 161 to 165 using Quadrature Phase Shift Keying (QPSK) modulation with Nyquist Pulse Shaping, although other modulation techniques may be used, including, but not limited to, Offset QPSK (OQPSK). Minimum Shift Keying (MSK), M-ary Phase Shift Keying (MPSK) and Gaussian Phase Shift Keying (GPSK).

The CDMA demodulator in either the RCS or the SU despreads the received signal with appropriate processing to combat or exploit multipath propagation effects. Parameters (concerning the received power level are used to generate the Automatic Power Control (APC) information which, in turn, is transmitted to the other end. The APC information is used to control transmit power of the automatic forward power control (AFPC) and automatic reverse power control (ARPC) links. In addition, each RCS 104, 105 and 110 can perform Maintenance Power Control (MPC), in a manner similar to APC, to adjust the initial transmit power of each SU 111, 112, 115, 117 and 118. Demodulation is coherent where the pilot signal provides the phase reference.

The transmit power levels of the radio interface between RCS 104 and SUs 111, 112, 115, 117 and 118 are controlled using two different closed loop power control algorithms. The Automatic Forward Power Control (AFPC) determines the Downlink transmit power level, and the Automatic Reverse Power Control (ARPC) determines the Uplink transmit power level. The logical control channel by which SU 111 and RCS 104, for example, transfer power control information operates at least a 16 kHz update rate. Other embodiments may use a faster 32 kHz update rate. These algorithms ensure that the transmit power of a user maintains an acceptable Bit-Error Rate (BER), maintains the system power at a minimum to conserve power, and maintains the power level of all SUs 111, 112, 115, 117 and 118. as received by RCS 104, at a nearly equal level.

In addition, the system includes an optional maintenance power algorithm that is used during the inactive mode of a SU. When SU 111 is inactive or powered-down to conserve power, the unit may occasionally activate itself and adjust its initial transmit power level setting in response to a maintenance power control signal from RCS 104. The maintenance power signal is determined by the RCS 104 by measuring the received power level of SU 111 and present system power level and calculating the necessary initial transmit power. The method shortens the channel acquisition time of SU 111 when it is turned on to begin a communication. The method also prevents the transmit power level of SU 111 from becoming too high and interfering with other channels during the initial transmission before the closed loop power control adjusts the transmit power to a level appropriate for the other message traffic in the channel.

The RCS 104 obtains synchronization of its clock from an interface line such as, but not limited to, E1, T1, or HDSL interfaces. Each RCS can also generate its own internal clock signal from an oscillator which may be regulated by a Global Positioning System (GPS) receiver. The RCS 104 generates a Global Pilot Code for a channel having a spreading code but no data modulation, which can be acquired by remote SUs 111 through 118. All transmission channels of the RCS are synchronous with the Pilot channel, and spreading code phases of code generators (not shown) used for Logical communication channels within RCS 104 are also synchronous with the Pilot channel's spreading code phase. Similarly, SUs 111 through 118 which receive the Global Pilot Code of RCS 104 synchronize the spreading and de-spreading code phases of the code generators (not shown) of the SUs to the Global Pilot Code.

Logical Communication Channels

A 'channel' of the prior art is usually regarded as a communications path that is part of an interface and that can be distinguished from other paths of the interface without regard to its content. In the case of CDMA, however, separate communications paths are distinguished only by their content. The term 'logical channel' is used to distinguish the separate data streams, which are logically equivalent to channels in the conventional sense. All logical channels and sub-channels of the present invention are mapped to a common 64 kilo-symbols per second (ksym/s) QPSK stream. Some channels are synchronized to associated pilot codes which are generated and perform a similar function to the system Global Pilot Code. The system pilot signals are not, however, considered logical channels.

Several logical communication channels are used over the RF communication link between the RCS and SU. Each logical communication channel either has a fixed, pre-determined spreading code or a dynamically assigned spreading code. For both pre-determined and assigned codes, the code phase is synchronous with the Pilot Code. Logical communication channels are divided into two groups: the Global Channel (GC) group and the Assigned Channel (AC) group. The GC group includes channels which are either transmitted from the base station RCS to all the remote SUs or from any SU to the RCS of the base station regardless of the SU's identity. These channels typically contain information of a given type for all users. These channels include the channels used by the SUs to gain system access. Channels in the Assigned Channels (AC) group are those channels dedicated to communication between the RCS and a particular SU.

Power Control

General

The power control feature of the present invention is used to minimize the transmit power used between an RCS and any SUs with which it is in communication. The power control subfeature that updates transmit power during bearer channel connection is defined as automatic power control (APC). APC data is transferred from the RCS to an SU on the forward APC channel and from an SU to the RCS on the reverse APC channel. When there is no active data link between the two, the maintenance power control subfeature (MPC) controls the transmit to power of the SU.

Transmit power levels of forward and reverse assigned channels and reverse global channels are controlled by the APC algorithm to maintain sufficient signal power to interference noise power ratio (SIR) on those channels, and to stabilize and minimize system output power. The present invention uses a closed loop power control system in which a receiver controls its associated transmitter to incrementally raise or lower its transmit power. This control is conveyed to the associated transmitter via the power control signal on the APC channel. The receiver makes the decision to increase or decrease the transmitter's power based on two error signals. One error signal is an indication of the difference between the measured and required despread signal powers, and the other error signal is an indication of the average received total power.

As used in the described embodiment of the invention, the term near-end power control is used to refer to adjusting the transmitter's output power in accordance with the APC signal received on the APC channel from the other end. This means the reverse power control for the SU and forward power control for the RCS; and the term far-end APC is used to refer to forward power control for the SU and reverse power control for the RCS (adjusting the transmit power of the unit at the opposite end of the channel).

In order to conserve power, the SU modem terminates transmission and powers-down while waiting for a call, defined as the sleep phase. Sleep phase is terminated by an awaken signal from the SU controller. Responsive to this signal, the SU modem acquisition circuit automatically enters the reacquisition phase, and begins the process of acquiring the downlink pilot, as described below.

Closed Loop Power Control Algorithms

The near-end power control includes two steps: first, set the initial transmit power, second, continually adjust transmit power according to information received from the far-end using APC.

For the SU, initial transmit power is set to a minimum value and then ramped up, for example, at a rate of 1 dB/ms until either a ramp-up timer expires (not shown) or the RCS changes the corresponding traffic light value on the FBCH to "red" indicating the RCS has locked to the SU's short pilot signal (SAXPT). Expiration of the timer causes the SAXPT transmission to be shut down, unless the traffic light value is set to red first, in which case the SU continues to ramp-up transmit power but at a much lower rate than before the "red" signal was detected.

The initial power ramp-up method is described in a U.S. patent application entitled A METHOD OF CONTROLLING INITIAL POWER RAMP-UP IN CDMA SYSTEMS BY USING SHORT CODES, filed on even date herewith, which is hereby incorporated by reference.

For the RCS, initial transmit power is set at a fixed value, corresponding to the minimum value necessary for reliable operation as determined experimentally for the service type and the current number of system users. Global channels, such as the Global Pilot or, the fast broadcast channel (FBCH), are always transmitted at the fixed initial power, whereas traffic channels are switched to APC.

The APC signal is transmitted as one bit signals on the APC channel. The one-bit signal represents a command to increase (signal is logic-high) or decrease (signal is logic-low) the associated transmit power. In the described embodiment, the 64 kbps APC data stream is not encoded or interleaved.

Far-end power control consists of the near-end transmitting power control information for the far-end to use in adjusting its transmit power.

The APC algorithm causes the RCS or the SU to transmit +1 if the following inequality holds, otherwise −1 (logic-low).

$$\alpha_1 e_1 - \alpha_2 e_2 > 0 \quad (1)$$

Here the error signal $e_1$ is calculated as $$e_1 = P_d - (1 + SNR_{REF}) P_N \quad (2)$$

where $P_d$ is the despread signal plus noise power, $P_N$ is the despread noise power, and $SNR_{REF}$ is the desired despread signal to noise ratio for the particular service type; and $$e_2 = P_r - P_o \quad (3)$$

where Pr is a measure of the received power and Po is the automatic gain control (AGC) circuit set point. The weights $\times$ and $\times$ in equation (30) are chosen for each service type and for the APC update rate.

Maintenance Power Control

During the sleep phase of the SU, the interference noise power of the CDMA RF channel changes. As an alternative to the initial power ramp-up method described above, the present invention may include a maintenance power control feature (MPC) which periodically adjusts the SU's initial transmit power with respect to the interference noise power of the CDMA channel. The MPC is the process whereby the transmit power level of an SU is maintained within close proximity of the minimum level required for the RCS to detect the SU's signal. The MPC process compensates for low frequency changes in the required SU transmit power.

The maintenance control feature uses two global channels: one is called the status channel (STCH) on reverse link, and the other is called the check-up channel (CUCH) on forward link. The signals transmitted on these channels carry no data and they are generated the same way the short codes used in initial power ramp-up are generated. The STCH and CUCH codes are generated from a "reserved" branch of the global code generator.

The MPC process is as follows. At random intervals, the SU sends a symbol length spreading code periodically for 3 ms on the status channel (STCH). If the RCS detects the sequence, it replies by sending a symbol length code sequence within the next 3 ms on the check-up channel (CUCH). When the SU detects the response from the RCS, it reduces its transmit power by a particular step size. If the SU does not detect any response from the RCS within the 3 ms period, it increases its transmit power by the step size. Using this method, the RCS response is transmitted at a power level that is enough to maintain a 0.99 detection probability at all SU's.

The rate of change of traffic load and the number of active users is related to the total interference noise power of the CDMA channel. The update rate and step size of the maintenance power update signal for the present invention is determined by using queuing theory methods well known in the art of communication theory, such as outlined in "Fundamentals of Digital Switching" (Plenum-New York) edited by McDonald and incorporated herein by reference. By modeling the call origination process as an exponential random variable with mean 6.0 mins, numerical computation shows the maintenance power level of a SU should be updated once every 10 seconds or less to be able to follow the changes in interference level using 0.5 dB step size. Modeling the call origination process as a Poisson random variable with exponential interarrival times, arrival rate of $2 \times 10^{-4}$ per second per user, service rate of $\frac{1}{360}$ per second, and the total subscriber population is 600 in the RCS service area also yields by numerical computation that an update rate of once every 10 seconds is sufficient when 0.5 dB step size is used.

Figure 2:
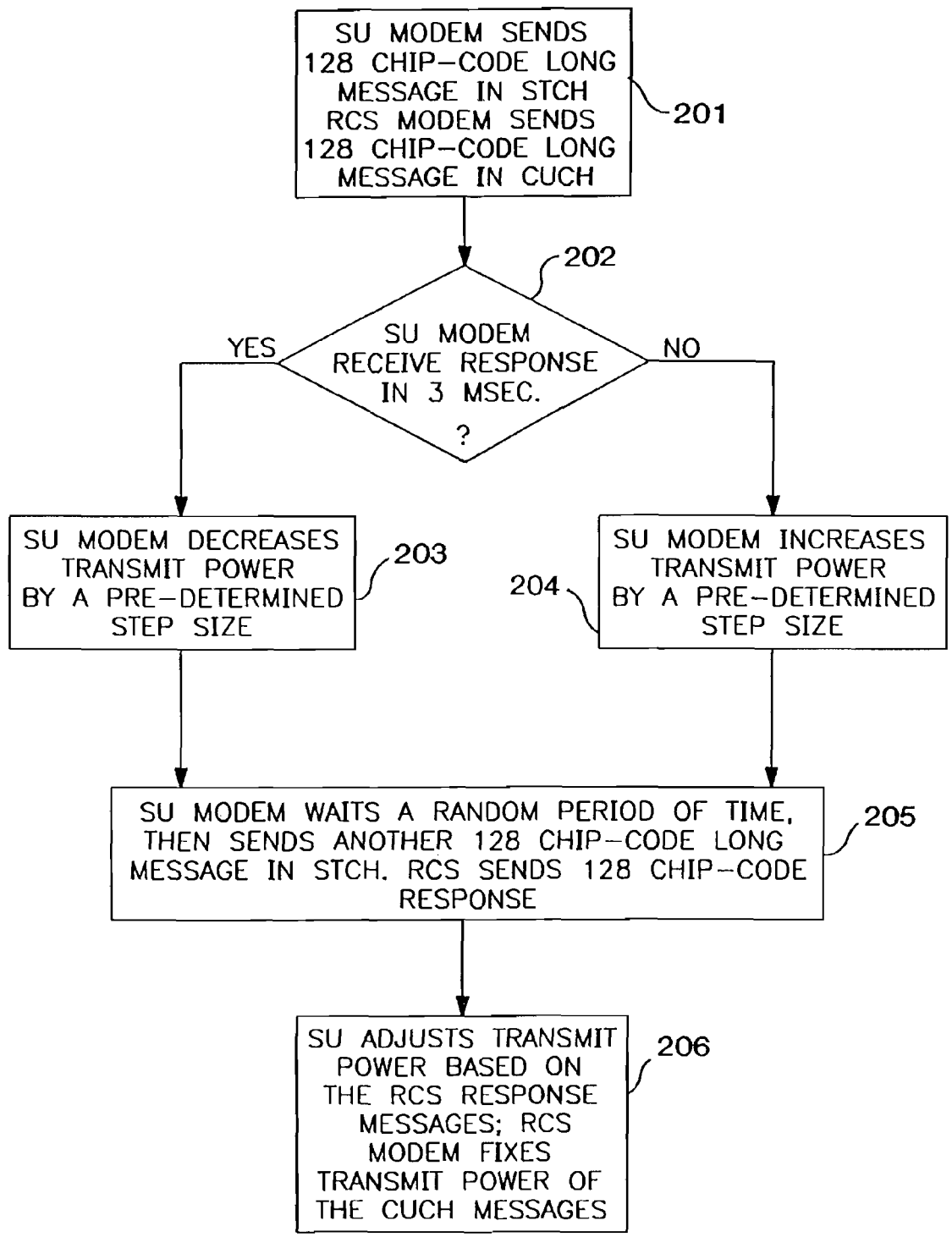
FIG. 2 is a flow-chart diagram of an exemplary maintenance power control algorithm of the present invention.

Maintenance power adjustment is performed periodically by the SU which changes from sleep phase to awake phase and performs the MPC process. Consequently, the process for the MPC feature is shown in FIG. 2 and is as follows: First, at step 201, signals are exchanged between the SU and the RCS maintaining a transmit power level that is close to the required level for detection: the SU periodically sends a symbol length spreading code in the STCH, and the RCS sends periodically a symbol length spreading code in the CUCH as response.

Next, at step 202, if the SU receives a response within 3 ms after the STCH message it sent, it decreases its transmit power by a particular step size at step 203; but if the SU does not receive a response within 3 ms after the STCH message, it increases its transmit power by the same step size at step 204.

The SU waits, at step 205, for a period of time before sending another STCH message, this time period is determined by a random process which averages 10 seconds.

Thus, the transmit power of the STCH messages from the SU is adjusted based on the RCS response periodically, and the transmit power of the CUCH messages from the RCS is fixed.

Mapping of Power Control Signal to Logical Channels For APC

Power control signals are mapped to specified Logical Channels for controlling transmit power levels of forward and reverse assigned channels. Reverse global channels are also controlled by the APC algorithm to maintain sufficient signal power to interference noise power ratio (SIR) on those reverse channels, and to stabilize and minimize system output power. The present invention uses a closed loop power control method in which a receiver periodically decides to incrementally raise or lower the output power of the transmitter at the other end. The method also conveys that decision back to the respective transmitter.

TABLE 1

APC Signal Channel Assignments

| Link Channels and Signals | Call/ Connection Status | Power Control Method | |
|---|---|---|---|
| | | Initial Value | Continuous |
| Reverse link AXCH AXPT | Being Established | as determined by power ramping | APC bits in forward APC channel |
| Reverse link APC, OW, TRCH, pilot signal | In-Progress | level established during call set-up | APC bits in forward APC channel |
| Forward link APC, OW, TRCH | In-Progress | fixed value | APC bits in reverse APC channel |

Forward and reverse links are independently controlled. For a call/connection in process, forward link traffic channel (TRCH) APC, and Order Wire (OW) power is controlled by the APC bits transmitted on the reverse APC channel. During the call/connection establishment process, reverse link access channel (AXCH) power is also controlled by the APC bits transmitted on the forward APC channel. Table 1 summarizes the specific power control methods for the controlled channels.

The required SIRs of the assigned channels TRCH, APC and OW and reverse assigned pilot signal for any particular SU are fixed in proportion to each other and these channels are subject to nearly identical fading, therefore, they are power controlled together.

Automatic Forward Power Control

Figure 3:
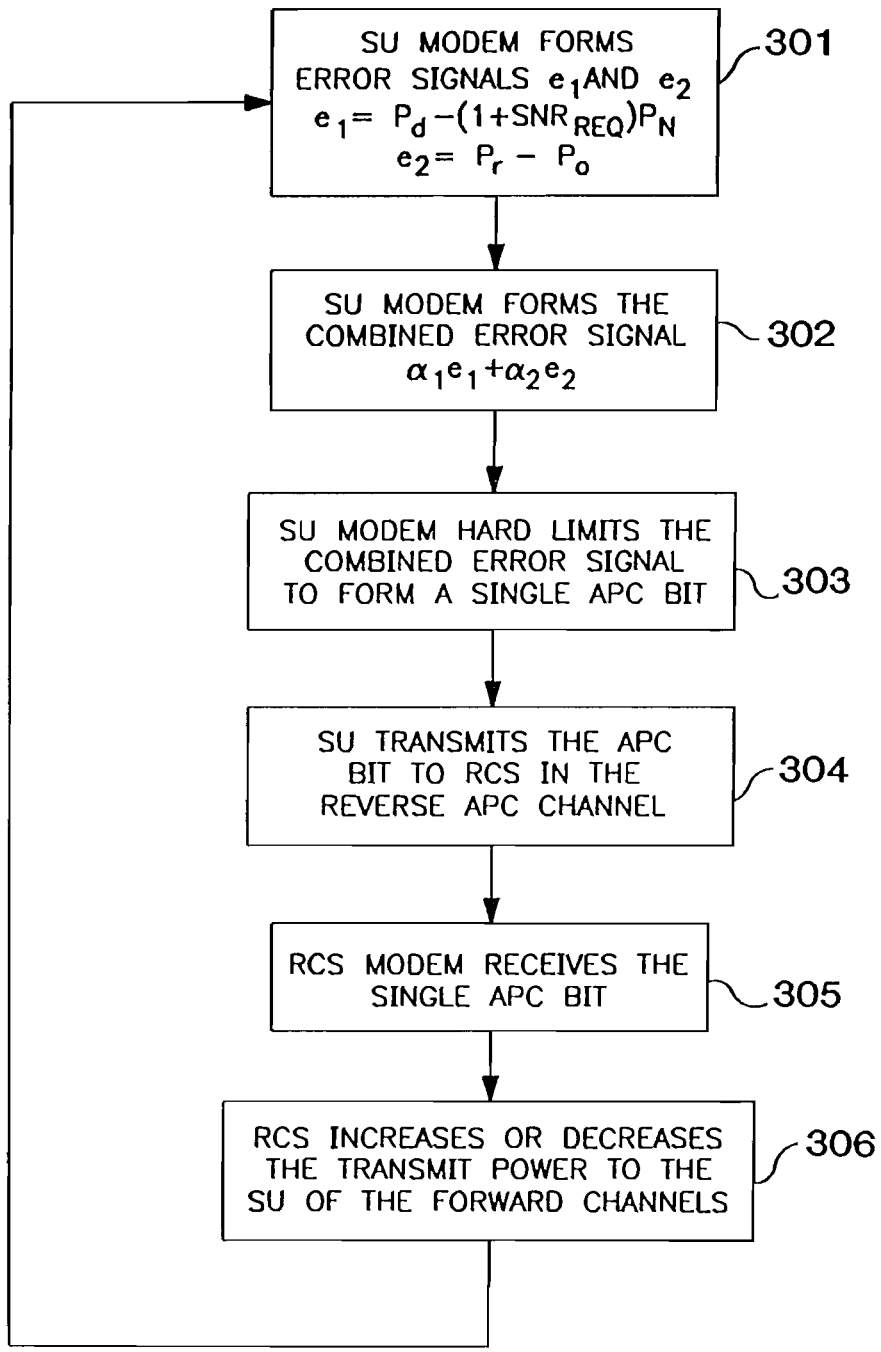
FIG. 3 is a flow-chart diagram of an exemplary automatic forward power control algorithm of the present invention.

The AFPC system attempts to maintain the minimum required SIR on the forward channels during a call/connection. The AFPC recursive process shown in FIG. 3 consists of the steps of having an SU form the two error signals $e_1$ and $e_2$ in step 301 where $$e_1 = P_d - (1 + SNR_{REQ}) P_N \quad (4)$$

$$e_2 = P_r - P_o \quad (5)$$

and $P_d$ is the despread signal plus noise power, $P_N$ is the despread noise power, $SNR_{REF}$ is the required signal to noise ratio for the service type, $P_r$ is a measure of the total received power, and $P_o$ is the AGC set point. Next, the SU modem forms the combined error signal $\mathcal{K} e_1 + \mathcal{K} e_2$ in step 302. Here, the weights $\mathcal{K}$ and $\mathcal{K}$ are chosen for each service type and APC update rate. In step 303, the SU hard limits the combined error signal and forms a single APC bit. The SU transmits the APC bit to the RCS in step 304 and RCS modem receives the bit in step 305. The RCS increases or decreases its transmit power to the SU in step 306 and the algorithm repeats starting from step 301.

Automatic Reverse Power Control

Figure 4:
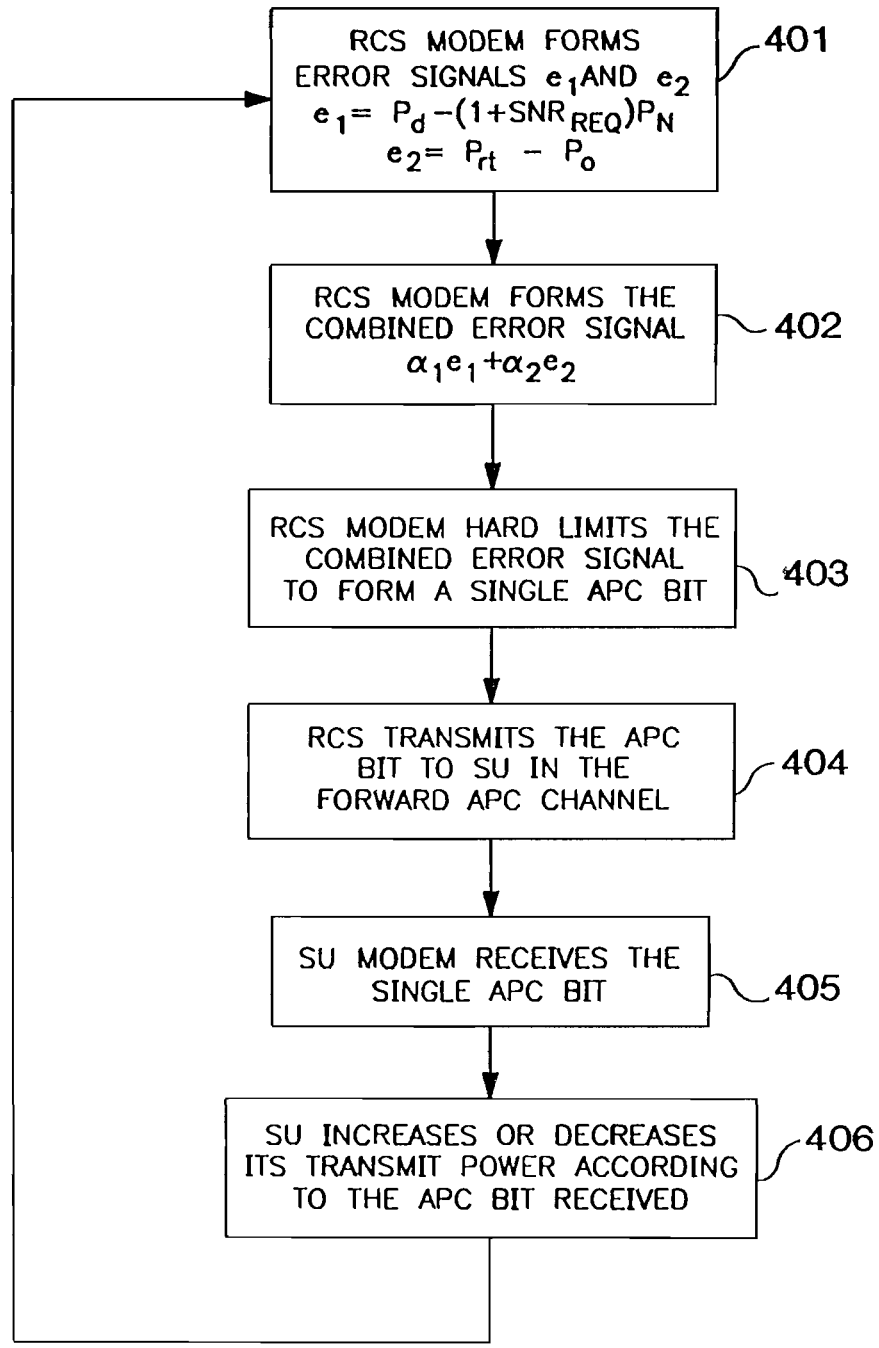
FIG. 4 is a flow-chart diagram of an exemplary automatic reverse power control algorithm of the present invention.

The ARPC system maintains the minimum required SIR on the reverse channels to minimize the total system reverse output power, during both call/connection establishment and while the call/connection is in progress. The ARPC recursive process shown in FIG. 4 begins at step 401 where the RCS modem forms the two error signals $e_1$ and $e_2$ in step 401 where $$e_1 = P_d - (1 + SNR_{REQ}) P_N \quad (6)$$

$$e_2 = P_{rt} - P_o \quad (7)$$

SIR and Multiple Channel Types

The required SIR for channels on a link is a function of channel format (e.g. TRCH, OW), service type (e.g. ISDN B, 32 kb/s ADPCM POTS) and the number of symbols over which data bits are distributed (e.g. two 64 kb/s symbols are integrated to form a single 32 kb/s ADPCM POTS symbol). Despreader output power corresponding to the required SIR for each channel and service type is predetermined. While a call/connection is in progress, several user CDMA logical channels are concurrently active; each of these channels transfers a symbol every symbol period. The SIR of the symbol from the nominally highest SIR channel is measured, compared to a threshold and used to determine the APC step up/down decision each symbol period. Table 2 indicates the symbol (and threshold) used for the APC computation by service and call type.

APC Parameters

APC information is always conveyed as a single bit of information, and the APC Data Rate is equivalent to the APC Update Rate. The APC update rate is 64 kb/s. This rate is high enough to accommodate expected Rayleigh and Doppler fades, and allow for a relatively high (~0.2) Bit Error Rate (BER) in the Uplink and Downlink APC channels, which minimizes capacity devoted to the APC.

The power step up/down indicated by an APC bit is nominally between 0.1 and 0.01 dB. The dynamic range for power control is 70 dB on the reverse link and 12 dB on the forward link for the exemplary embodiment of the present system. and $P_d$ is the despread signal plus noise power, $P_N$ is the despread noise power. $SNR_{REF}$ is the reference signal to noise ratio for the service type, $P_{rt}$ is a measure of the average total power received by the RCS, and $P_o$ is the AGC set point. The RCS modem forms the combined error signal $\mathcal{K} e_1 + \mathcal{K} e_2$ in step 402 and hard limits this error signal to determine a single APC bit in step 403. The RCS transmits the APC bit to the SU in step 404, and the bit is received by the SU in step 405. Finally, SU adjusts its transmit power according to the received APC bit in step 406, and the process repeats starting from step 401.

TABLE 2

Symbols/Thresholds Used for APC Computation

| Service or Call Type | Call/Connection Status | Symbol (and Threshold) Used for APC Decision |
|---|---|---|
| Don't care | Being Established | AXCH |
| ISDN D SU | In-Progress | one $\frac{1}{64}$-KBPS symbol from TRCH (ISDN-D) |
| ISDN 1B + D SU | In-Progress | TRCH (ISDN-B) |
| ISDN 2B + D SU | In-Progress | TRCH (one ISDN-B) |
| POTS SU (64 KBPS PCM) | In-Progress | one $\frac{1}{64}$-KBPS symbol from TRCH, use 64 KBPS PCM threshold |
| POTS SU (32 KBPS ADPCM) | In-Progress | one $\frac{1}{64}$-KBPS symbol from TRCH, use 32 KBPS ADPCM threshold |
| Silent Maintenance Call (any SU) | In-Progress | OW (continuous during a maintenance call) |

An Alternative Embodiment for Multiplexing APC Information

The dedicated APC and OW logical channels described previously can also be multiplexed together in one logical channel. The APC information is transmitted at 64 kb/s. continuously whereas the OW information occurs in data bursts. The alternative multiplexed logical channel includes the unencoded, non-interleaved 64 kb/s. APC information on, for example, the In-phase channel and the OW information on the quadrature channel of the QPSK signal.

Closed Loop Power Control Implementation

The closed loop power control during a call connection responds to two different variations in overall system power. First, the system responds to local behavior such as changes in power level of an SU, and second, the system responds to changes in the power level of the entire group of active users in the system.

Figure 5A:
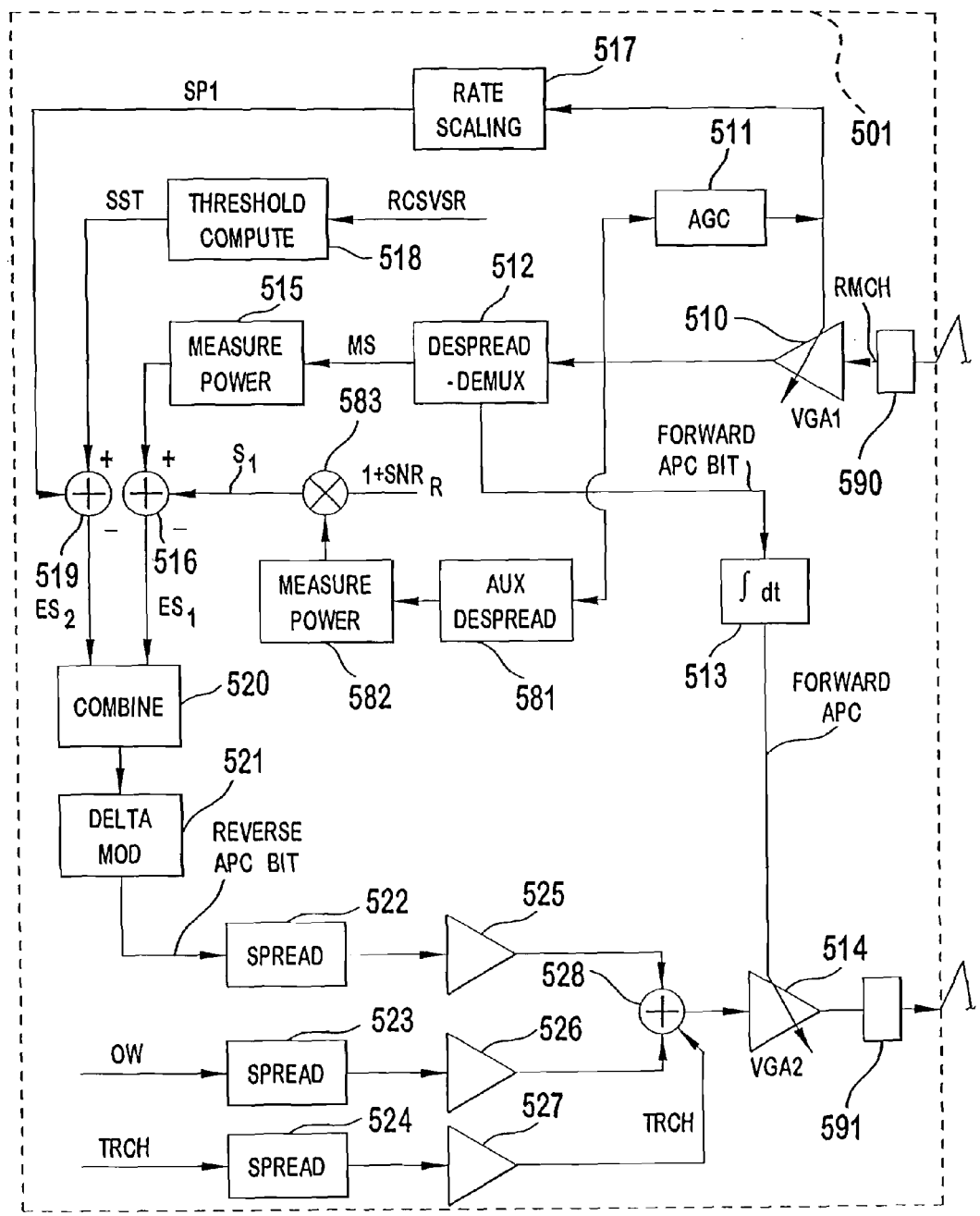
FIG. 5A and FIG. 5B is a block diagram of an exemplary closed loop power control system of the present invention when the bearer channel is established.
Figure 5B:
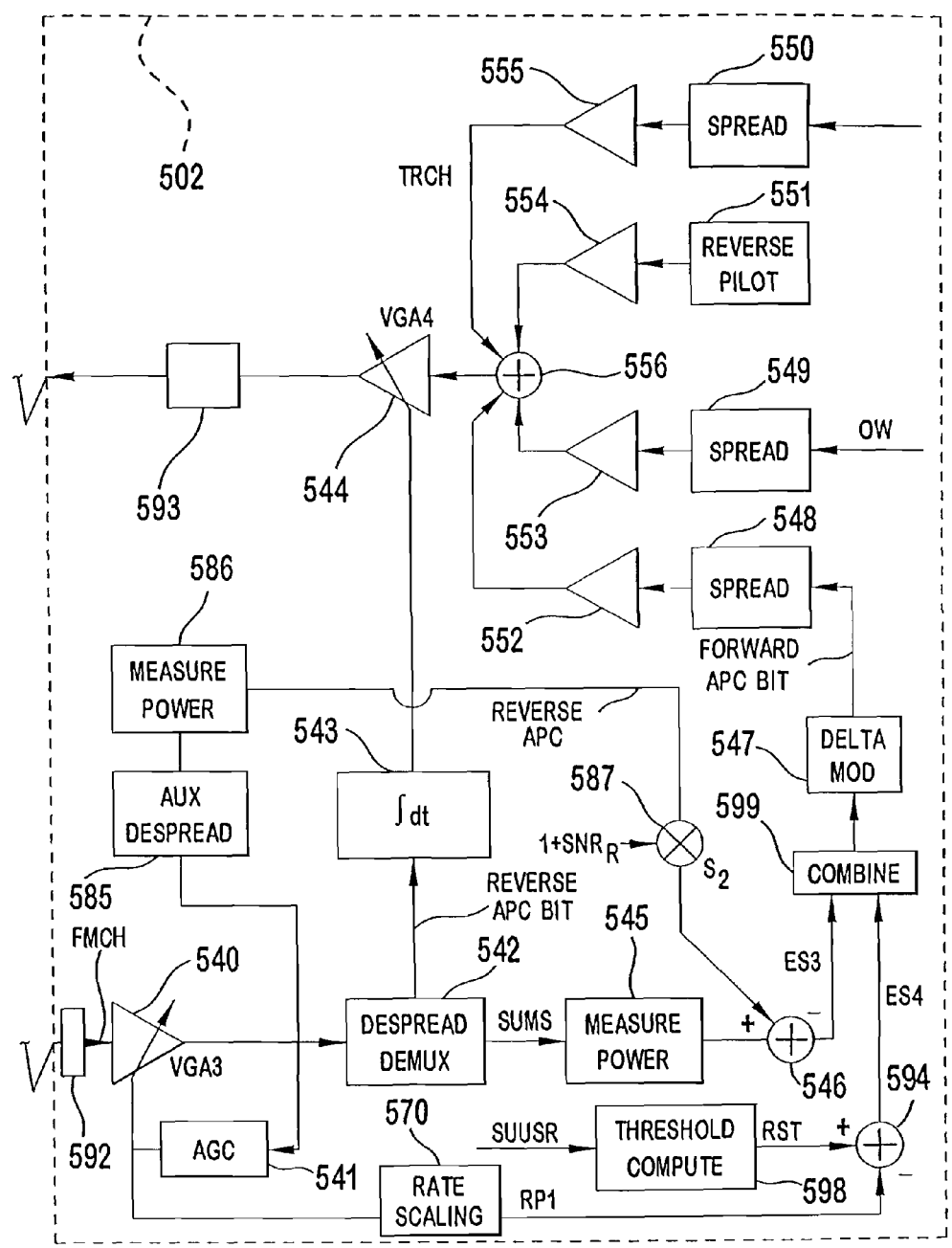

The Power Control system of the exemplary embodiment of the present invention is shown in FIG. 5A and FIG. 5B. As shown, the circuitry used to adjust the transmitted power is similar for the RCS (shown as the RCS power control module 501) and SU (shown as the SU power control module 502). Beginning with the RCS power control module 501, the reverse link RF channel signal is received at the RF antenna 590 and demodulated to produce the reverse CDMA signal RMCH which is applied to the variable gain amplifier (VGA1) 510. The output signal of VGA1 510 is provided to the Automatic Gain Control (AGC) Circuit 511 which produces a variable gain amplifier control signal into the VGA1 510. This signal maintains the level or the output signal of VGA1 510 at a near constant value. The output signal of VGA1 is despread by the despread-demultiplexer (demux) 512 which produces a despread user message signal MS and a forward APC bit. The forward APC bit is applied to the integrator 513 to produce the Forward APC control signal. The Forward APC control signal controls the Forward Link VGA2 514 and maintains the Forward Link RF channel signal at a minimum level necessary for communication.

The signal power of the despread user message signal MS of the RCS power module 501 is measured by the power measurement circuit 515 to produce a signal power indication. The output of the VGA1 is also despread by the AUX despreader 581 which despreads the signal by using an uncorrelated spreading code, and hence obtains a despread noise signal. The power measurement taken at power measurement device 582 of this signal is multiplied at multiplier 583 by 1 plus the required signal to noise ratio (SNRR) to form the threshold signal S1. The difference between the despread signal power and the threshold value S1 is produced by the subtracter 516. This difference is the error signal ES1 which is an error signal relating to the particular SU transmit power level. Similarly the control signal for the VGA1 510 is applied to the rate scaling circuit 517 to reduce the rate of the control signal for VGA1 510. The output signal of scaling circuit 517 is a scaled system power level signal SP1. The Threshold Compute logic 518 computes the System Signal Threshold SST value from the RCS user channel power data signal (RCSUSR). The complement of the Scaled system power level signal, SP1, and the System Signal Power Threshold value SST are applied to the adder 519 which produces second error signal ES2. This error signal is related to the system transmit power level of all active SUs. The input Error signals ES1 and ES2 are combined in the combiner 520 produce a combined error signal input to the delta modulator (DM1) 521, and the output signal of the DM1 is the reverse APC bit stream signal, having bits of value+1 or −1, which for the present invention is transmitted as a 64 kb/sec signal.

The Reverse APC bit is applied to the spreading circuit 522 and the output signal of the spreading circuit 522 is the spread-spectrum forward APC message signal. Forward OW and Traffic signals are also provided to spreading circuits 523, 524, producing forward traffic message signals 1, 2, . . . N. The power level of the forward APC signal, the forward OW, and traffic message signals are adjusted by the respective amplifiers 525, 526 and 527 to produce the power level adjusted forward APC, OW, and TRCH channels signals. These signals are combined by the adder 528 and applied to the VAG2 514, which produces forward link RF channel signal. The forward link RF channel signal is transmitted by transmitter 591.

The forward link RF channel signal including the spread forward APC signal is received by the RF antenna 592 of the SU, and demodulated to produce the forward CDMA signal FMCH. This signal is provided to the variable gain amplifier (VGA3) 540. The output signal of VGA3 is applied to the Automatic Gain Control Circuit (AGC) 541 which produces a variable gain amplifier control signal to VGA3 540. This signal maintains the level of the output signal of VGA3 at a near constant level. The output signal of VAG3 540 is despread by the despread demux 542, which produces a despread user message signal SUMS and a reverse APC bit. The reverse APC bit is applied to the integrator 543 which produces the Reverse APC control signal. This reverse APC control signal is provided to the Reverse APC VGA4 544 to maintain the Reverse link RF channel signal at a minimum power level.

The despread user message signal SUMS is also applied to the power measurement circuit 545 producing a power measurement signal which is added to the complement of threshold value S2 in the adder 546 to produce error signal ES3. The signal ES3 is an error signal relating to the RCS transmit power level for the particular SU. To obtain threshold S2, the despread noise power indication at measure power device 586 from the AUX despreader 585 is multiplied at multiplier 587 by 1 plus the desired signal to noise ratio $SNR_R$. The AUX despreader 585 despreads the input data using an uncorrelated spreading code, hence its output is an indication of the despread noise power.

Similarly, the control signal for the VGA3 is applied to the rate scaling circuit 570 to reduce the rate of the control signal for VGA3 in order to produce a scaled received power level RP1 (see FIG. 5A and FIG. 5B). The threshold compute 598 circuit computes the received signal threshold RST from SU measured power signal SUUSR. The complement of the scaled received power level RP1 and the received signal threshold RST are applied to the adder 594 which produces error signal ES4. This error is related to the RCS transmit power to all other SUs. The input error signals ES3 and ES4 are combined in the combiner 599 and input to the delta modulator DM2 547, and the output signal of DM2 547 is the forward APC bit stream signal, with bits having value of value+1 or −1. In the exemplary embodiment of the present invention this signal is transmitted as a 64 kb/sec signal.

The Forward APC bit stream signal is applied to the spreading circuit 2948 to produce the output reverse spread-spectrum APC signal. Reverse OW and Traffic signals are also input to spreading circuits 549, 550, producing reverse OW and traffic message signals 1, 2 . . . N and the reverse pilot is generated by the reverse pilot generator 551. The power level of the reverse APC message signal reverse OW message signal, reverse pilot, and the reverse traffic message signals are adjusted by amplifiers 552, 553, 554, 555 to produce the signals which are combined by the adder 556 and input to the reverse APC VGA4 544. It is this VGA4 544 which produces the reverse link RF channel signal. The reverse link RF channel signal is transmitted by transmitter 593.

Figure 6A:
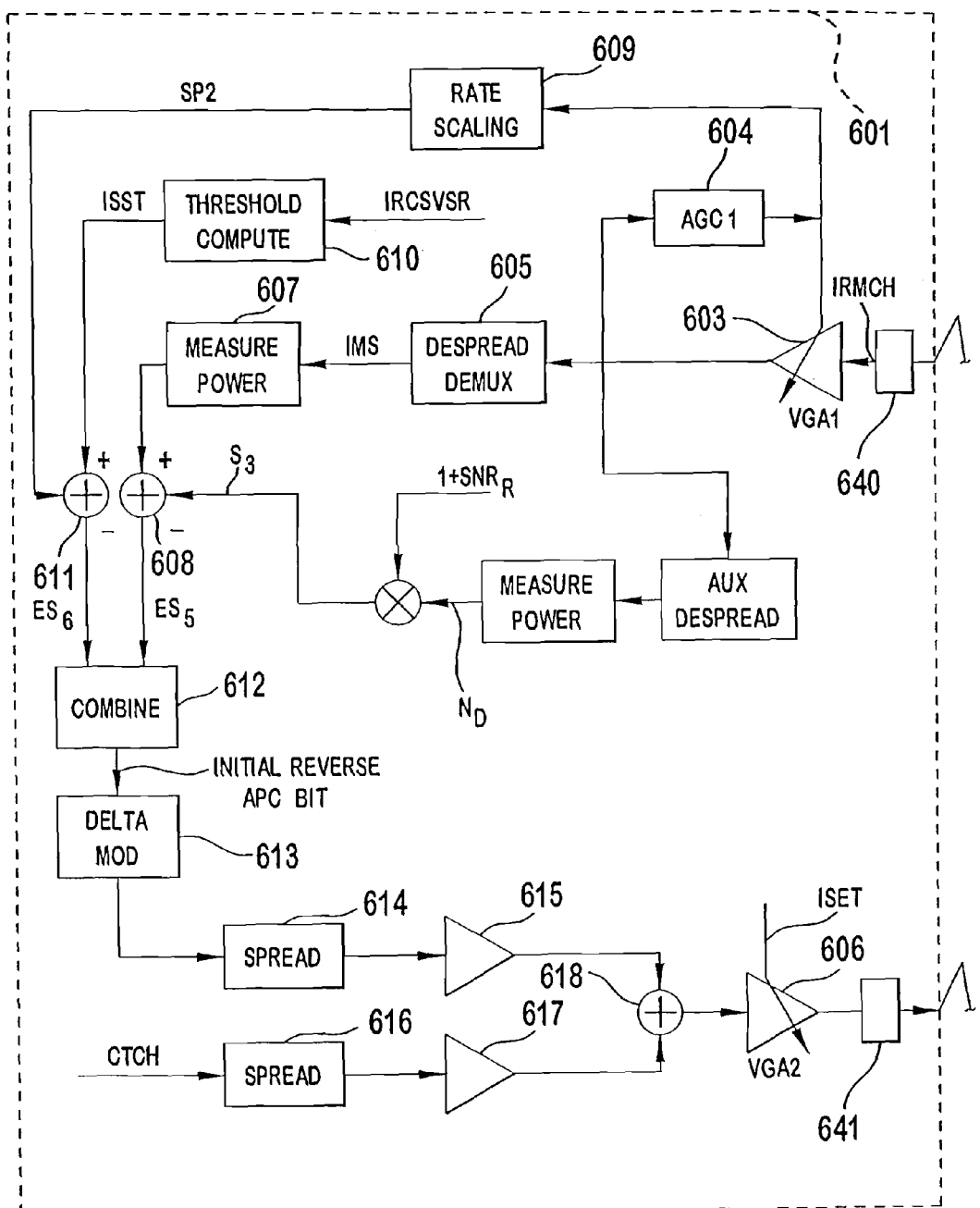
FIG. 6A and FIG. 6B is a block diagram of an exemplary closed loop power control system of the present invention during the process of establishing the bearer channel.
Figure 6B:
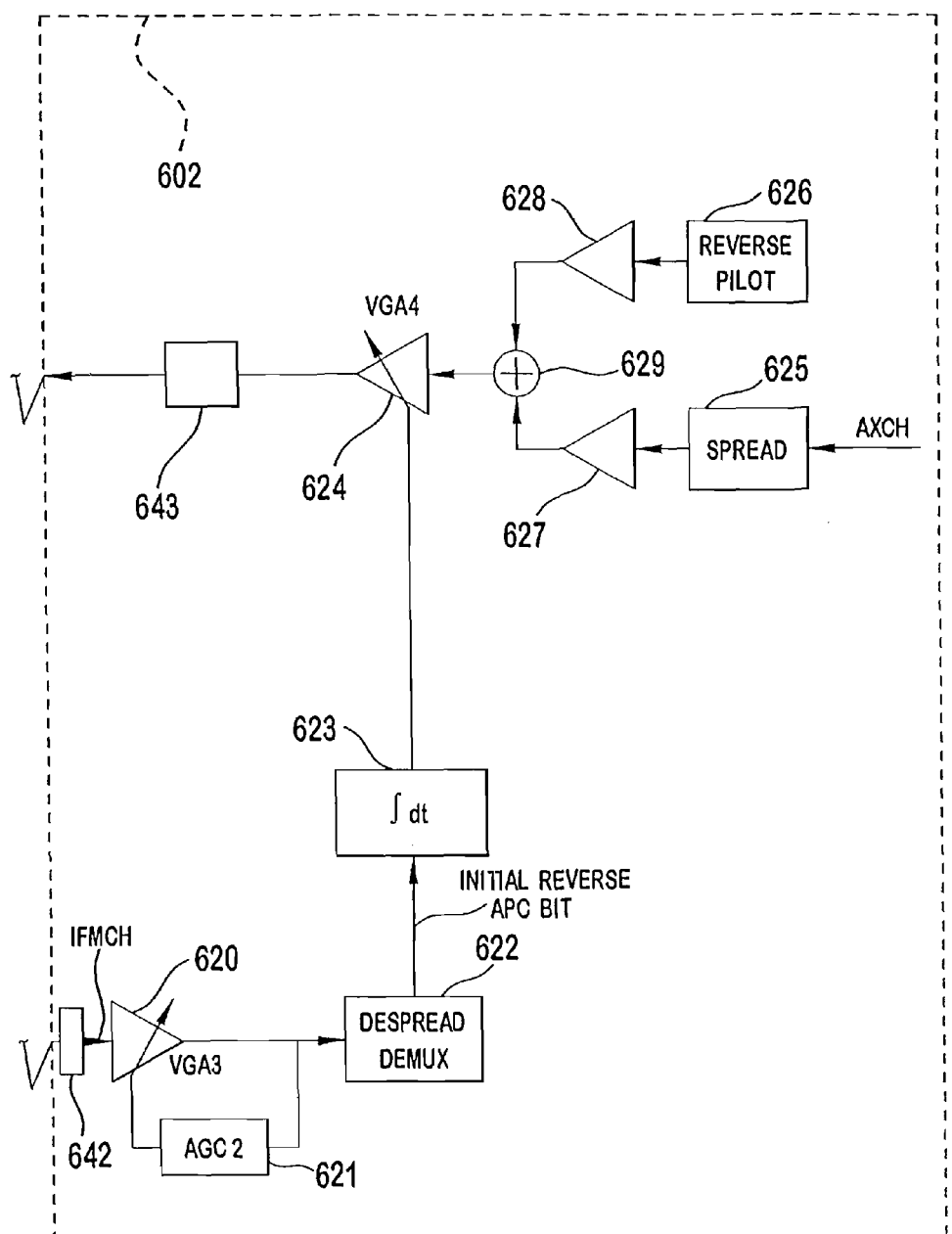

During the call connection and bearer channel establishment process, the closed loop power control of the present invention is modified, and is shown in FIG. 6A and FIG. 6B. As shown, the circuits used to adjust the transmitted power are different for the RCS, shown as the Initial RCS power control module 601; and for the SU, shown as the Initial SU power control module 602. Beginning with the Initial RCS power control module 601, the reverse link RF channel signal is received at the RF antenna 640 and demodulated producing the reverse CDMA signal IRMCH which is received by the first variable gain amplifier (VGA 1) 603. The output signal of VGA1 is detected by the Automatic Gain Control Circuit (AGC1) 604 which provides a variable gain amplifier control signal to VGA1 603 to maintain the level of the output signal of VAG1 at a near constant value. The output signal of VGA1 is despread by the despread demultiplexer 605 which produces a despread user message signal IMS. The Forward APC control signal, ISET, is set to a fixed value, and is applied to the Forward Link Variable Gain Amplifier (VGA2) 606 to set the Forward Link RF channel signal at a predetermined level.

The signal power of the despread user message signal IMS of the Initial RCS power module 601 is measured by the power measure circuit 607, and the output power measurement is subtracted from a threshold value S3 in the subtracter 608 to produce error signal ES5 which is an error signal relating to the transmit power level of a particular SU. The threshold S3 is calculated by multiplying at multiplier 652 the despread power measurement at measure power device 651 obtained from the AUX despreader 650 by 1 plus the desired signal to noise ratio SNR. The AUX despreader 650 despreads the signal using an uncorrelated spreading code, hence its output signal is an indication of despread noise power. Similarly, the VGA1 control signal is applied to the rate scaling circuit 609 to reduce the rate of the VGA1 control signal in order to produce a scaled system power level signal SP2. The threshold computation logic 610 determines an Initial System Signal Threshold value (ISST) computed from the user channel power data signal (IRC-SUSR). The complement of the scaled system power level signal SP2 and the (ISST) are provided to the adder 611 which produces a second error signal ES6, which is an error signal relating to the system transmit power level of all active SUs. The value of ISST is the desired transmit power for a system having the particular configuration. The input Error signals ES5 and ES6 are combined in the combiner 612 produce a combined error signal input to the delta modulator (DM3) 613. DM3 produces the initial reverse APC bit stream signal, having bits of value+1 or −1, which for the present invention is transmitted as a 64 kb/sec signal.

The Reverse APC bit stream signal is applied to the spreading circuit 614. to produce the initial spread-spectrum forward APC signal. The control channel (CTCH) information is spread by the spreader 616 to form the spread CTCH message signal. The spread APC and CTCH signals are scaled by the amplifiers 615 and 617 and combined by the combiner 618. The combined signal is applied to VAG2 606 which produces the forward link RF channel signal. The forward link RF channel signal is transmitted by transmitter 641.

The forward link RF channel signal including the spread forward APC signal is received by the RF antenna 642 of the SU and demodulated to produce the initial forward CDMA signal (IFMCH) which is applied to the variable gain amplifier (VGA3) 620. The output signal of VGA3 is detected by the Automatic Gain Control Circuit (AGC2) 621 which produces a variable gain amplifier control signal for the VGA3 620. This signal maintains the output power level of the VGA3 620 at a near constant value. The output signal of VAG3 is despread by the despread demultiplexer 622 which produces an initial reverse APC bit that is dependent on the output level of VGA3. The reverse APC bit is processed by the integrator 623 to produce the Reverse APC control signal. The Reverse APC control signal is provided to the Reverse APC VGA4 624 to maintain Reverse link RF channel signal at a defined power level the reverse link RF channel signal is transmitted by transmitter 643.

The global channel AXCH signal is spread by the spreading circuits 625 to provide the spread AXCH channel signal. The reverse pilot generator 626 provides a reverse pilot signal, and the signal power of AXCH and the reverse pilot signal are adjusted by the respective amplifiers 627 and 628. The spread AXCH channel signal and the reverse pilot signal are added by the adder 629 to produce reverse link CDMA signal. The reverse link CDMA signal is received by the reverse APC VGA4 624, which produces the reverse link RF channel signal output to the RF transmitter.

System Capacity Management

The system capacity management algorithm of the present invention optimizes the maximum user capacity for an RCS area, called a cell. When the SU comes within a certain value of maximum transmit power, the SU sends an alarm message to the RCS. The RCS sets the traffic lights which control access to the system, to "red" which, as previously described, is a flag that inhibits access by the SU's. This condition remains in effect until the alarming SU terminates its call, or until the transmit power of the alarming SU, measured at the SU, is a value less than the maximum transmit power. When multiple SUs send alarm messages, the condition remains in effect until either all calls from alarming SUs terminate, or until the transmit power of the alarming SU, measured at the SU, is a value less than the maximum transmit power. An alternative embodiment measures the bit error rate measurements from the Forward Error Correction (FEC) decoder, and holds the RCS traffic lights at "red" until the bit error rate is less than a predetermined value.

The blocking strategy of the present invention includes a method which uses the power control information transmitted from the RCS to an SU, and the received power measurements at the RCS. The RCS measures its transmit power level, detects that a maximum value is reached, and determines when to block new users. An SU preparing to enter the system blocks itself if the SU reaches the maximum transmit power before successful completion of a bearer channel assignment.

Each additional user in the system has the effect of increasing the noise level for all other users, which decreases the signal to noise ratio (SNR) that each user experiences. The power control algorithm maintains a desired SNR for each user. Therefore, in the absence of any other limitations, addition of a new user into the system has only a transient effect and the desired SNR is regained.

The transmit power measurement at the RCS is done by measuring either the root mean square (rms) value of the baseband combined signal or by measuring the transmit power of the RF signal and feeding it back to digital control circuits. The transmit power measurement may also be made by the SUs to determine if the unit has reached its maximum transmit power. The SU transmit power level is determined by measuring the control signal of the RF amplifier, and scaling the value based on the service type, such as plain old telephone service (POTS), FAX, or integrated services digital network (ISDN).

The information that an SU has reached the maximum power is transmitted to the RCS by the SU in a message on the Assigned Channels. The RCS also determines the condition by measuring reverse APC changes because, if the RCS sends APC messages to the SU to increase SU transmit power, and the SU transmit power measured at the RCS is not increased, the SU has reached the maximum transmit power.

The RCS does not use traffic lights to block new users who have finished ramping-up using the short codes. These users are blocked by denying them the dial tone and letting them time out. The RCS sends all 1's (go down commands) on the APC Channel to make the SU lower its transmit power. The RCS also sends either no CTCH message or a message with an invalid address which would force the FSU to abandon the access procedure and start over. The SU does not start the acquisition process immediately because the traffic lights are red.

When the RCS reaches its transmit power limit, it enforces blocking in the same manner as when an SU reaches its transmit power limit. The RCS turns off all the traffic lights on the FBCH, starts sending all I APC bits (go down commands) to those users who have completed their short code ramp-up but have not yet been given dial tone, and either sends no CTCH message to these users or sends messages with invalid addresses to force them to abandon the access process.

The self blocking algorithm of the SU is as follows. When the SU starts transmitting the AXCH, the APC starts its power control operation using the AXCH and the SU transmit power increases. While the transmit power is increasing under the control of the APC, it is monitored by the SU controller. If the transmit power limit is reached, the SU abandons the access procedure and starts over.

Although the invention has been described in terms of an exemplary embodiment, it is understood by those skilled in the art that the invention may be practiced with modifications to the embodiment that are within the scope of the invention as defined by the following claims:

What is claimed is:

1. A code division multiple access (CDMA) subscriber unit comprising:
   circuitry configured to receive at least one power control command on a forward channel, wherein the at least one power control command indicates either an increase or decrease in transmission power level; and
   circuitry configured to adjust transmission power levels, of both a first reverse channel including traffic data and a second reverse channel including pilot bits, based on a value of the at least one power control command, wherein the transmission power levels of the first reverse channel and the second reverse channel are different.

2. The CDMA subscriber unit of claim 1, wherein the transmission power levels, of both the first reverse channel and the second reverse channel, are adjusted by a step size in response to the at least one power control command.

3. The CDMA subscriber unit of claim 1, further comprising circuitry configured to transmit, in bursts, a third reverse channel including signaling information.

4. The CDMA subscriber unit of claim 1, further comprising circuitry configured to transmit a third reverse channel including control information, wherein the third reverse channel has a different transmission power level than the first reverse channel.

5. The CDMA subscriber unit of claim 1, further comprising circuitry configured to transmit a third reverse channel including traffic data, wherein the third reverse channel has a different transmission power level than the first reverse channel.

6. The CDMA subscriber unit of claim 1, further comprising circuitry configured to transmit a third reverse channel including control information and a fourth reverse channel including traffic data, wherein at least one of the third or fourth reverse channels has a different transmission power level than the first reverse channel.

7. The CDMA subscriber unit of claim 6, wherein a data rate of the first reverse channel and the fourth reverse channel are different.

8. The CDMA subscriber unit of claim 1, wherein a gain of the second reverse channel is different from a gain of the first reverse channel.

9. A method implemented in a code division multiple access (CDMA) subscriber unit, the method comprising:
   receiving at least one power control command on a forward channel, wherein the at least one power control command indicates either an increase or a decrease in transmission power level; and
   adjusting transmission power levels, of both a first reverse channel including traffic data and a second reverse channel including pilot bits, based on a value of the at least one power control command, wherein the transmission power levels of the first reverse channel and the second reverse channel are different.

10. The method of claim 9, wherein the transmission power levels, of both the first reverse channel and the second reverse channel, are adjusted by a step size in response to the at least one power control command.

11. The method of claim 9, further comprising transmitting, in bursts, a third reverse channel including signaling information.

12. The method of claim 9, further comprising transmitting a third reverse channel including control information, wherein the third reverse channel has a different transmission power level than the first reverse channel.

13. The method of claim 9, further comprising transmitting a third reverse channel including traffic data, wherein the third reverse channel has a different transmission power level than the first reverse channel.

14. The method of claim 9, further comprising transmitting a third reverse channel including control information and a fourth reverse channel including traffic data, wherein at least one of the third or fourth reverse channels has a different transmission power level than the first reverse channel.

15. The method of claim 14, wherein a data rate of the first reverse channel and the fourth reverse channel are different.

16. The method of claim 9, wherein a gain of the second reverse channel is different from a gain of the first reverse channel.

17. A code division multiple access (CDMA) subscriber unit comprising:
   an antenna; and
   a modem, operatively coupled to the antenna; and
   the antenna and the modem are configured to receive at least one power control command on a forward channel, wherein the at least one power control command indicates either an increase or decrease in transmission power level; and
   the modem is further configured to adjust transmission power levels, of both a first reverse channel including traffic data and a second reverse channel including pilot bits, based on a value of the at least one power control command wherein the transmission power levels of the first reverse channel and the second reverse channel are different; and
   the modem and the antenna are configured to transmit the first reverse channel and the second reverse channel.

18. The CDMA subscriber unit of claim 17, wherein the transmission power levels, of both the first reverse channel and the second reverse channel, are adjusted by a step size in response to the at least one power control command.

19. The CDMA subscriber unit of claim 17, wherein the modem and the antenna are further configured to transmit, in bursts, a third reverse channel including signaling information.

20. The CDMA subscriber unit of claim 17, wherein the modem and the antenna are further configured to transmit a third reverse channel including control information, wherein the third reverse channel has a different transmission power level than the first reverse channel.

21. The CDMA subscriber unit of claim 17, wherein the modem and the antenna are further configured to transmit a third reverse channel including traffic data, wherein the third reverse channel has a different transmission power level than the first reverse channel.

22. The CDMA subscriber unit of claim 17, wherein the modem and the antenna are further configured to transmit a third reverse channel including control information and a fourth reverse channel including traffic data, wherein at least one of the third or fourth reverse channels has a different transmission power level than the first reverse channel.

23. The CDMA subscriber unit of claim 22, wherein a data rate of the first reverse channel and the fourth reverse channel are different.

24. The CDMA subscriber unit of claim 17, wherein a gain of the second reverse channel is different from a gain of the first reverse channel.

* * * * *